(12) United States Patent
Shelnutt et al.

(10) Patent No.: US 10,156,873 B2
(45) Date of Patent: Dec. 18, 2018

(54) INFORMATION HANDLING SYSTEM HAVING FLUID MANIFOLD WITH EMBEDDED HEAT EXCHANGER SYSTEM

(71) Applicant: DELL PRODUCTS, L.P., Round Rock, TX (US)

(72) Inventors: Austin Michael Shelnutt, Leander, TX (US); Travis C. North, Cedar Park, TX (US); Christopher M. Helberg, Austn, TX (US); Edmond I. Bailey, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 329 days.

(21) Appl. No.: 15/016,234

(22) Filed: Feb. 4, 2016

(65) Prior Publication Data

US 2017/0177041 A1 Jun. 22, 2017

Related U.S. Application Data

(60) Provisional application No. 62/270,564, filed on Dec. 21, 2015, provisional application No. 62/270,563, filed on Dec. 21, 2015.

(51) Int. Cl.
*H05K 7/20* (2006.01)
*G06F 1/20* (2006.01)
(Continued)

(52) U.S. Cl.
CPC ............. *G06F 1/20* (2013.01); *G05B 19/404* (2013.01); *G05B 19/416* (2013.01); *G05B 2219/50324* (2013.01); *G06F 2200/201* (2013.01)

(58) Field of Classification Search
CPC ............... H05K 7/20627; H05K 7/207; H05K 7/20781; G05B 2219/50324; G05B 19/404; G06F 1/20; G06F 2200/201
(Continued)

(56) References Cited

U.S. PATENT DOCUMENTS 5,758,607 A 6/1998 Brendel et al.
6,462,949 B1 10/2002 Parish et al.
(Continued)

OTHER PUBLICATIONS

Dravininkas, Adam B., Restriction Requirement, U.S. Appl. No. 15/049,074, The United States Patent and Trademark Office, dated Jul. 13, 2017.
(Continued)

*Primary Examiner* — Michael J Brown
(74) *Attorney, Agent, or Firm* — Isidore PLLC

(57) ABSTRACT

A Rack Information Handling System (RIHS) has a liquid-to-liquid heat exchanger (LTLHE) that is received in a rear section of a rack and includes node-receiving supply port/s and return port/s. LTLHE includes a first liquid manifold extending between the node-receiving supply port/s and the node-receiving return port/s. LTLHE includes a second liquid manifold capable of being in sealed fluid connection to a supply conduit and a return conduit of a liquid cooling supply for fluid transfer of a second cooling liquid. LTLHE includes a transfer plate formed of thermally conductive material separating the first and second liquid manifolds for transferring heat from the first cooling liquid to the second cooling liquid. RIHS includes a node-receiving chassis configured to receive inserted liquid cooled nodes that sealingly engage for fluid transfer of the first liquid to LTLHE embedded in the rack for heat absorption and transfer by the second liquid.

19 Claims, 17 Drawing Sheets

(51) Int. Cl.
   *G05B 19/404* (2006.01)
   *G05B 19/416* (2006.01)
(58) Field of Classification Search
   USPC .......................................................... 700/282
   See application file for complete search history.

(56) References Cited

U.S. PATENT DOCUMENTS

| | | | |
|---|---|---|---|
| 6,574,104 B2 | 6/2003 | Patel et al. | |
| 6,775,137 B2 | 8/2004 | Chu et al. | |
| 7,013,955 B2 | 3/2006 | Phillips et al. | |
| 7,106,590 B2 | 9/2006 | Chu et al. | |
| 7,403,384 B2 | 7/2008 | Pflueger | |
| 7,657,347 B2 | 2/2010 | Campbell et al. | |
| 7,944,694 B2* | 5/2011 | Campbell | H05K 7/20809 165/104.33 |
| 7,963,119 B2 | 6/2011 | Campbell et al. | |
| 7,990,709 B2 | 8/2011 | Campbell et al. | |
| 8,387,249 B2 | 3/2013 | Campbell et al. | |
| 8,405,975 B2 | 3/2013 | Helberg et al. | |
| 8,422,218 B2 | 4/2013 | Fried et al. | |
| 8,516,284 B2 | 8/2013 | Chan et al. | |
| 8,564,951 B1 | 10/2013 | Watanabe et al. | |
| 8,583,290 B2 | 11/2013 | Campbell et al. | |
| 8,749,968 B1* | 6/2014 | Branton | H05K 7/20754 165/80.4 |
| 8,797,740 B2 | 8/2014 | Campbell et al. | |
| 8,824,143 B2 | 9/2014 | Campbell et al. | |
| 8,842,433 B2 | 9/2014 | Koblenz et al. | |
| 8,934,244 B2 | 1/2015 | Shelnutt et al. | |
| 8,978,401 B2 | 3/2015 | Chainer et al. | |
| 9,045,995 B2 | 6/2015 | Graybill et al. | |
| 9,069,532 B2 | 6/2015 | Campbell et al. | |
| 9,250,636 B2 | 2/2016 | Chainer et al. | |
| 9,386,727 B2 | 7/2016 | Barringer et al. | |
| 9,451,726 B2* | 9/2016 | Regimbal | H05K 7/20236 |
| 9,496,200 B2 | 11/2016 | Lyon et al. | |
| 10,010,013 B2 | 6/2018 | Shelnutt et al. | |
| 2004/0190247 A1 | 9/2004 | Chu et al. | |
| 2004/0221604 A1 | 11/2004 | Ota et al. | |
| 2005/0122685 A1 | 6/2005 | Chu et al. | |
| 2005/0248922 A1 | 11/2005 | Chu et al. | |
| 2008/0067805 A1 | 3/2008 | Kamada et al. | |
| 2008/0232064 A1 | 9/2008 | Sato et al. | |
| 2008/0276639 A1 | 11/2008 | Stoddard | |
| 2009/0086428 A1 | 4/2009 | Campbell et al. | |
| 2009/0086432 A1 | 4/2009 | Campbell et al. | |
| 2009/0126909 A1 | 5/2009 | Ellsworth et al. | |
| 2009/0126910 A1 | 5/2009 | Campbell et al. | |
| 2009/0154096 A1 | 6/2009 | Iyengar et al. | |
| 2009/0165868 A1 | 7/2009 | Pearson | |
| 2009/0259343 A1 | 10/2009 | Rasmussen et al. | |
| 2009/0262501 A1 | 10/2009 | Claassen et al. | |
| 2010/0032142 A1 | 2/2010 | Copeland et al. | |
| 2010/0103614 A1 | 4/2010 | Campbell et al. | |
| 2010/0103618 A1 | 4/2010 | Campbell et al. | |
| 2011/0060470 A1 | 3/2011 | Campbell et al. | |
| 2011/0075373 A1 | 3/2011 | Campbell et al. | |
| 2011/0083621 A1 | 4/2011 | Ogunleye et al. | |
| 2011/0112694 A1 | 5/2011 | Bash et al. | |
| 2011/0313576 A1 | 12/2011 | Nicewonger | |
| 2012/0180979 A1 | 7/2012 | Harrington | |
| 2013/0098085 A1 | 4/2013 | Judge et al. | |
| 2013/0106265 A1 | 5/2013 | Shelnutt et al. | |
| 2013/0112378 A1 | 5/2013 | Shelnutt et al. | |
| 2013/0128455 A1 | 5/2013 | Koblenz et al. | |
| 2013/0229769 A1 | 9/2013 | Yang | |
| 2013/0264046 A1 | 10/2013 | Chainer et al. | |
| 2013/0312839 A1 | 11/2013 | Shelnutt et al. | |
| 2013/0312846 A1 | 11/2013 | Eriksen et al. | |
| 2013/0312854 A1 | 11/2013 | Eriksen et al. | |
| 2014/0202678 A1 | 7/2014 | Goth et al. | |
| 2014/0203550 A1 | 7/2014 | Utsch | |
| 2014/0218859 A1 | 8/2014 | Shelnutt et al. | |
| 2014/0321056 A1 | 10/2014 | Yoshikawa et al. | |
| 2014/0328562 A1 | 11/2014 | Pitwon | |
| 2015/0109735 A1 | 4/2015 | Campbell et al. | |
| 2015/0233597 A1 | 8/2015 | Dempster et al. | |
| 2015/0334878 A1 | 11/2015 | Long et al. | |
| 2016/0066480 A1 | 3/2016 | Eckberg et al. | |
| 2016/0242319 A1 | 8/2016 | Edwards et al. | |
| 2016/0242326 A1 | 8/2016 | Edwards et al. | |
| 2016/0366792 A1 | 12/2016 | Smith et al. | |
| 2017/0049009 A1 | 2/2017 | Steinke et al. | |
| 2017/0181322 A1 | 6/2017 | Shelnutt et al. | |
| 2017/0181323 A1 | 6/2017 | Shelnutt et al. | |

OTHER PUBLICATIONS

Dravininkas, Adam, Ex Parte Quayle Action, U.S. Appl. No. 15/016,249, The United States Patent and Trademark Office, Oct. 24, 2017.
Dravininkas, Adam, Non-Final Office Action, U.S. Appl. No. 15/049,074, The United States Patent and Trademark Office, dated Nov. 14, 2017.
Suryawanshi, Suresh, Non-Final Office Action, U.S. Appl. No. 15/017,604, The United States Patent and Trademark Office, dated Dec. 22, 2017.
Suryawanshi, Suresh, Non-Final Office Action, U.S. Appl. No. 15/017,451, The United States Patent and Trademark Office, dated Dec. 14, 2017.
Suryawanshi, Suresh, Non-Final Office Action, U.S. Appl. No. 15/017,492, The United States Patent and Trademark Office, dated Nov. 3, 2017.
Ahmad, Yahya A., Non-Final Office Action, U.S. Appl. No. 15/016,226, The United States Patent and Trademark Office, dated Apr. 7, 2017.
Brown, Robert D., Notice of Allowance, U.S. Appl. No. 15/017,582, The United States Patent and Trademark Office, dated Jun. 13, 2017.
Dravininkas, Adam B., Non-Final Office Action, U.S. Appl. No. 15/016,249, The United States Patent and Trademark Office, dated Jun. 20, 2017.
Dravininkas, Adam B., Notice of Allowance, U.S. Appl. No. 15/016,249, The United States Patent and Trademark Office, dated Feb. 26, 2018.
Brown, Robert D., Non-Final Office Action, U.S. Appl. No. 15/698,642, The United States Patent and Trademark Office, dated May 24, 2018.
Dravinikas, Adam, Final Office Action, U.S. Appl. No. 15/049,074, The United States Patent and Trademark Office, dated Apr. 27, 2018.
Suryawanshi, Suresh, Notice of Allowance, U.S. Appl. No. 15/017,604, The United States Patent and Trademark Office, dated Jun. 6, 2018.
Suryawanshi, Suresh, Notice of Allowance, U.S. Appl. No. 15/017,492, The United States Patent and Trademark Office, dated May 2, 2018.
Patent Cooperation Treaty (PCT), International Preliminary Report on Patentability, International Application No. PCT/US2016/031379, dated Jun. 26, 2018.

* cited by examiner

INFORMATION HANDLING SYSTEM HAVING FLUID MANIFOLD WITH EMBEDDED HEAT EXCHANGER SYSTEM

PRIORITY

The present invention claims priority from each of the following provisional patent applications, with relevant content of each listed provisional application incorporated herein by reference: Provisional Application Ser. No. 62/270,563, with filing date Dec. 21, 2015; and Provisional Application Ser. No. 62/270,564, with filing date Dec. 21, 2015.

BACKGROUND

1. Technical Field

The present disclosure generally relates to information handling systems (IHS), and more particular to removing heat from a direct-interface liquid cooled (DL) rack-configured IHS (RIHS) using a liquid-to-liquid heat exchanger.

2. Description of the Related Art

As the value and use of information continue to increase, individuals and businesses seek additional ways to process and store information. One option available to users is an Information Handling System (IHS). An IHS generally processes, compiles, stores, and/or communicates information or data for business, personal, or other purposes, thereby allowing users to take advantage of the value of the information. Technology and information handling needs and requirements vary between different users or applications. IHSs may vary regarding what information is handled, how the information is handled, how much information is processed, stored, or communicated, as well as how quickly and efficiently the information is processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node and requiring more directed cooling solutions. Extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks.

BRIEF SUMMARY

The illustrative embodiments of the present disclosure provides an Information Handling System (IHS) including a node-receiving chassis having a front access side and an opposing rear side. At least one liquid cooled (LC) node inserted into a bay of the node-receiving chassis. The LC node includes a node enclosure provisioned with at least one heat-generating component. The node enclosure is provisioned with an internal node-level liquid cooling system of conduits. The system includes at least one node supply conduit connected for fluid transfer to at least one supply conduit intake port. The system includes at least one node return conduit connected for fluid transfer to at least one return conduit output port. The at least one supply conduit intake and return conduit output ports are located at an inserted end of the node enclosure. The at least one supply conduit intake and return conduit output ports are oriented toward the opposing rear side of the node-receiving chassis respectively enabling receipt of a first cooling liquid at a first temperature and return of the first cooling liquid at an increased temperature due to heat absorption within the node enclosure. A liquid-to-liquid heat exchanger (LTLHE) is positioned towards the rear side of the node-receiving chassis. LTLHE includes at least one node-receiving supply port and at least one node-receiving return port oriented facing the opposing rear side of the chassis. The node-receiving supply and return ports enable sealed engagement, for first cooling liquid transfer, to the at least one supply conduit intake port and from the at least one return conduit output port of the at least one LC node. LTLHE includes a first liquid manifold extending between the at least one node-receiving supply port and the at least one node-receiving return port. The first liquid manifold is in sealed fluid connection to the intake and output ports of the node-level liquid cooling system of conduits. The first liquid manifold provides a first liquid cooling loop for continuous flow of the first liquid through the at least one LC node and through the first liquid manifold. A second liquid manifold is capable of being in sealed fluid connection to a supply conduit and a return conduit of a liquid cooling supply for fluid transfer of a second cooling liquid. A transfer plate formed of thermally conductive material separates the first and second liquid manifolds for transferring heat from the first cooling liquid to the second cooling liquid.

According to one aspect, the present disclosure provides a Rack Information Handling System (RIHS) that includes a rack having one or node-receiving bays. An LTLHE is received in a rear section of the rack. The LTLHE includes at least one node-receiving supply port and at least one node-receiving return port. The LTLHE includes a first liquid manifold extending between the at least one node-receiving supply port and the at least one node-receiving return port. The LTLHE includes a second liquid manifold capable of being in sealed fluid connection to a supply conduit and a return conduit of a liquid cooling supply for fluid transfer of a second cooling liquid. The LTLHE includes a transfer plate formed of thermally conductive material and separating the first and second liquid manifolds for transferring heat from the first cooling liquid to the second cooling liquid. A node-receiving chassis has a front access side and an opposing rear side and having a bay configured to receive an inserted at least one LC node. LC node includes a node enclosure provisioned with at least one heat-generating component. An internal node-level liquid cooling system of conduits includes at least one node supply conduit connected for fluid transfer to at least one supply conduit intake port and at least one node return conduit connected for fluid transfer to at least one return conduit output port. The at least one supply conduit intake and return conduit output ports are located at an inserted end of the node enclosure and oriented toward the opposing rear side of the node-receiving chassis. The supply conduit intake and return conduit output ports sealingly engage for fluid transfer respectively at least one node-receiving supply port and at least one node-receiving return port. The supply conduit intake and return conduit output ports enable receipt of a first cooling liquid at a first temperature and return of the first cooling liquid at an increased temperature due to heat absorption within the first liquid manifold.

According to one aspect, the present disclosure provides a power node including a power node enclosure receivable in a power node-receiving bay of a rack. The power node enclosure is sealed to contain immersion cooling liquid. The power node enclosure is provisioned with at least one heat generating component that receives, converts, and/or distributes electrical power for use by other nodes within the RIHS. A power node inlet port and at least one power distribution outlet port respectively receives facility power and distributes power to the internal RIHS components. At least one liquid to liquid heat transfer mechanism has a first surface that is impinged upon by a volume of at least one of the immersion cooling liquid and immersion cooling liquid vapor. The at least one liquid to liquid heat transfer mechanism has a second surface that receives a flow of a second cooling liquid via a liquid manifold providing a system of conduits. The system of conduits is sealably engaged to the supply and return conduits of the liquid cooling supply to enable a flow of the second cooling liquid manifold to absorb heat from the power node enclosure.

According to one aspect, the present disclosure provides a method of assembling an RIHS. In one or more embodiments, the method includes mounting in a rack a node-receiving chassis having a front access side and an opposing rear side. The method includes attaching in a rear section of the rack the LTLHE. The method includes inserting the at least one LC node into a bay of the node-receiving chassis.

According to one aspect, the present disclosure provides a method of assembling an RIHS. The method includes inserting one or more nodes containing electrical power consuming components into one or node-receiving bays of a rack. The method includes inserting into the rack a power node having a power node enclosure sealed to contain immersion cooling liquid and provisioned with at least one heat generating component. The method includes electrically connecting a power node inlet port and at least one power distribution outlet port of the power node to rack electrical power distribution components. The power node inlet port and at least one power distribution outlet port respectively receives facility power and distributes power to the internal IHS components. The method includes sealingly engaging for fluid transfer at least one liquid to liquid heat transfer mechanism. The liquid to liquid heat transfer mechanism has a first surface that is impinged upon by a volume of at least one of the immersion cooling liquid and immersion cooling liquid vapor. The liquid to liquid heat transfer mechanism has a second surface that receives a flow of a second cooling liquid via a liquid manifold. The liquid manifold provides a system of conduits that is sealably engaged to the supply and return conduits of the liquid cooling supply. The sealing engagement enables a flow of the second cooling liquid manifold to absorb heat from the power node enclosure.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
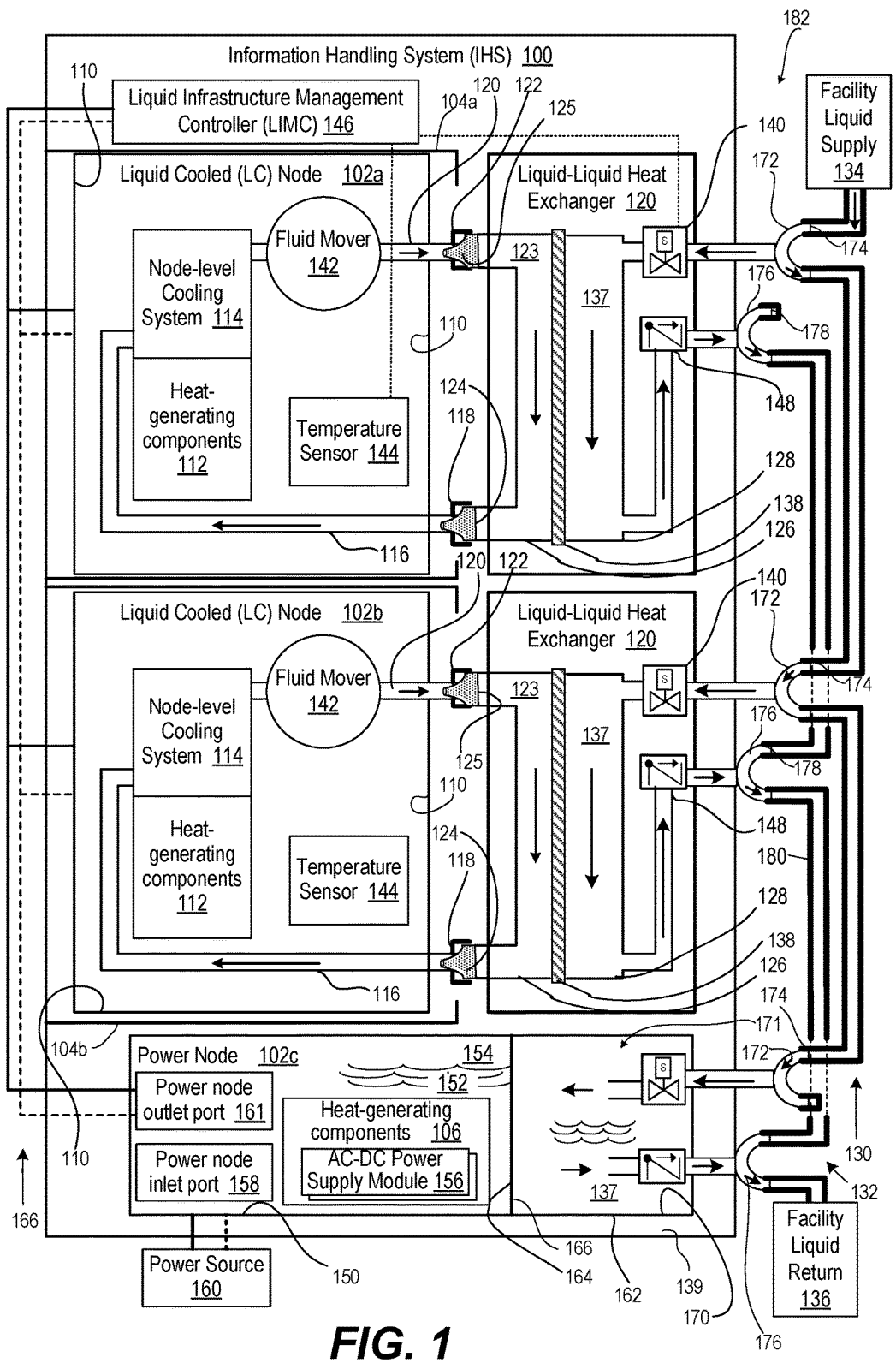
FIG. 1 illustrates a side perspective view of an internal layout/configuration of an example Liquid-Cooled (LC) Information Handling System (IHS) that utilizes an embedded Liquid-to-Liquid Heat Exchanger (LTLHE), according to one or more embodiments.

A Rack Information Handling System (RIHS) has a liquid-to-liquid heat exchanger (LTLHE) that is received in a rear section of a rack and includes node-receiving supply port/s and return port/s. LTLHE includes a first liquid manifold extending between the node-receiving supply port/s and the node-receiving return port/s. LTLHE includes a second liquid manifold capable of being in sealed fluid connection to a supply conduit and a return conduit of a liquid cooling supply for fluid transfer of a second cooling liquid. LTLHE includes a transfer plate formed of thermally conductive material separating the first and second liquid manifolds for transferring heat from the first cooling liquid to the second cooling liquid. RIHS includes a node-receiving chassis configured to receive inserted liquid cooled nodes that sealingly engage for fluid transfer of the first liquid to LTLHE embedded in the rack for heat absorption and transfer by the second liquid.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1 U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspects of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. The present disclosure addresses and overcomes the challenges with distributing liquid cooling fluids throughout an IT rack having nodes with a large number of variations in distribution components.

In addition to direct-interfacing of liquid cooling to the primary heat generating components of the rack such as the processor, the present disclosure also includes additional consideration for cooling of secondary equipment and auxiliary components within the rack utilizing fluid-to-fluid heat exchanger methodology. Additionally, the present disclosure provides a modular approach to utilizing an air-to-liquid heat exchanger with quick connection and scalability to allow the solution to be scalable in both 1 U and 2 U increments.

FIG. 1 illustrates an Information Handling System (IHS) 100 that includes liquid cooled (LC) nodes 102a-102b and an immersion-cooled power node 102c (collectively "nodes" 102). The LC nodes 102a-102b are respectively received in node-receiving chasses 104a-104b each having a front access side and an opposing rear side. A node enclosure 110 of each LC node 102a-102b is provisioned with heat-generating component/s 112 and an internal node-level LC system 114 of conduits. The LC system 114 includes node supply conduit/s 116 connected for fluid transfer to supply conduit intake port/s 118. The LC system 114 includes node return conduit/s 120 connected for fluid transfer to return conduit output port/s 122. The supply conduit intake and return conduit output ports 118, 122 are located at an inserted end of the node enclosure 110 and are oriented toward the opposing rear side of the node-receiving chassis 104a-104b respectively. The supply conduit intake and return conduit output ports 118, 122 respectively enable receipt of a first cooling liquid 123 at a first temperature and return of the first cooling liquid 123 at an increased temperature due to heat absorption within the node enclosure 110. A liquid-to-liquid heat exchanger (LTLHE) 120 is positioned towards the rear side of each node-receiving chassis 104a-104b.

Each LTLHE 120 includes node-receiving supply port/s 124 and node-receiving return port/s 125 that are oriented facing the opposing rear side of the chassis 104a-104b to enable sealed engagement, for first cooling liquid transfer, to the supply conduit intake port/s 116 and from the return conduit output port/s 118 of the respective LC node 102a-102b. A first liquid manifold 126 extends between the node-receiving supply port/s 124 and the node-receiving return port/s 118. The first liquid manifold 126 is engageably in sealed fluid connection to the intake and output ports 118, 122 of the node-level LC system 114 of conduits to provide a first liquid cooling loop for continuous flow of the first liquid through the at least one LC node 102a-102b and through the first liquid manifold 126. A second liquid manifold 128 is capable of being in sealed fluid connection to a supply conduit 130 and a return conduit 132 of a liquid cooling supply, such as a facility liquid supply 134 and a facility liquid return 136, for fluid transfer of a second cooling liquid 137. A transfer plate 138 is formed of thermally conductive material. The transfer plate 138 separates the first and second liquid manifolds 126, 128 for transferring heat from the first cooling liquid to the second cooling liquid 137.

In one or more embodiments, nodes 102 are received in a block chasses 104a-104b that are mounted to, or that is integral to, a rack 139. A dynamic control valve 140 can dynamically regulate liquid flow through the second liquid manifold 128 of the LTLHE 120. A fluid mover 142, such as a pump on a cold plate, can dynamically regulate liquid flow through the first liquid manifold 126. Sensor/s 144 that detect intake, internal or exhausted temperatures, moisture levels, or liquid pressure are positioned to detect a temperature within the nodes 102. A liquid infrastructure management controller (LIMC) 146 is in communication with the sensor/s 144 and the dynamic control valve 140 to control an amount of liquid flow in response to the temperature detected by the sensor/s 144. A check valve 148 can prevent backflow into the second liquid manifold 128.

The power node 102c has a power node enclosure 150 sealed to contain immersion cooling liquid/s 152, such as a dielectric liquid, and immersion cooling liquid vapor 154. The power node enclosure 150 is provisioned with heat generating component/s 112 that include redundant AC-to-DC power supply modules 156. The redundant AC-to-DC power supply modules 156 has a power node inlet port 158 that receives AC electrical power from a power source 160, such as a facility electrical circuit. The redundant AC-to-DC power supply modules 156 has power distribution outlet port/s 161 that distributes DC electrical power for use by other nodes 102 a-102b within the IHS 100. The power node 102c includes a liquid-to-liquid heat transfer mechanism 162 that has a first surface 164 that is impinged upon by a volume of the immersion cooling liquid/s 152 and immersion cooling liquid vapor 154 and a second surface 166 that receives a flow of a second cooling liquid 137, such as facility water, via a liquid manifold 170. The liquid manifold 170 provides a system 171 of conduits that is sealably engaged to the supply and return conduits 130, 132 of the liquid cooling supply provided by facility liquid supply and return 134, 136. The liquid manifold 170 enables a flow of the second cooling liquid 137 to absorb heat from the power node enclosure 150.

In one or more embodiments, the second liquid manifold 128 of the LTLHE 120 and the liquid manifold 170 of the liquid-to-liquid heat transfer mechanism 162 of the power node 102c each include a supply bypass tube 172 terminating in the two supply connections 174 and a return bypass tube 176 terminating in two return connections 178. The dynamic control valve 140 directs a portion of the second cooling liquid 137 from the supply bypass tube 172 to the node-receiving input port/s 125. The check valve 148 allows forward flow only of the cooling liquid that has absorbed heat from the heat-generating component/s 112 from the node 102 back to return bypass tube 176. In one or more embodiments, the supply and return conduits 130, 132 can be Modular Liquid Distribution (MLD) conduits 180 to connect in succession respectively the supply bypass tubes 172, 176 to form a liquid rail 182.

In one or more embodiments, a liquid rail can include a series of secondary conduits, such as supply divert conduit and return divert conduit that provides a by-pass fluid path for each of MLD conduits 180. In operation, divert conduit/s allow for the removal of corresponding MLD conduit 180, thus removing the flow of cooling liquid to the particular block of nodes, without interrupting the flow of cooling liquid to the other surrounding blocks of computer gear. For example, a particular MLD conduit 180 can be replaced due to a leak. For another example, a block liquid manifold 128 can be replaced. The inclusion of divert conduits thus enables rapid servicing and maintenance of block liquid manifold 128 and/or nodes within block chassis without having to reconfigure the MLD conduits 180. In addition, the IHS 100 can continue operating as cooling liquid continues to be provided to the remainder of the blocks that are plugged into the liquid rail. Re-insertion of the MLD conduit 180 then reconnects the flow of cooling liquid to the block for normal cooling operations, and shuts off the diverted flow of cooling liquid. In an exemplary embodiment, the MLD conduits 180 provide a quick disconnect feature that interrupts flow when not fully engaged to a respective ports. Disconnection of an MLD conduit 180 interrupts flow in a primary portion of the liquid rail for either supply or return, shifting flow through one or more divert conduits to provide cooling liquid to the other block liquid manifolds 120. In one or more embodiments, a manual or active shutoff valve can interrupt flow on either or both of the primary or divert portions of the liquid rail.

Figure 2:
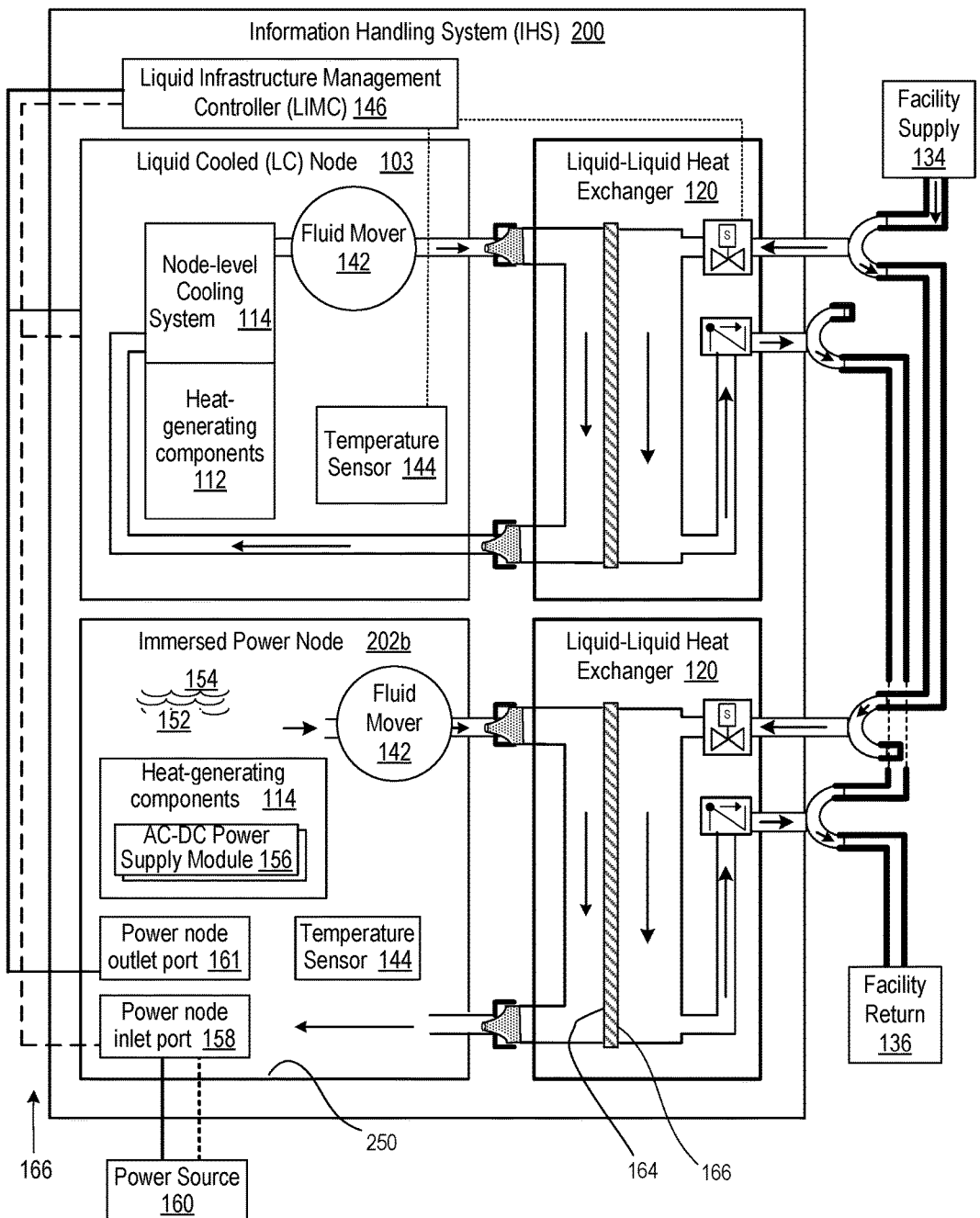
FIG. 2 illustrates a side perspective view of an internal layout/configuration of another example LC IHS that utilizes an embedded LTLHE, according to one or more embodiments.

FIG. 2 depicts an example IHS 200 having components an LC power node 202b inserted into the node-receiving chassis 104b. Liquid cooling is provided by an LTLHE 120 rather than being integral to a power node enclosure 250.

Figure 3:
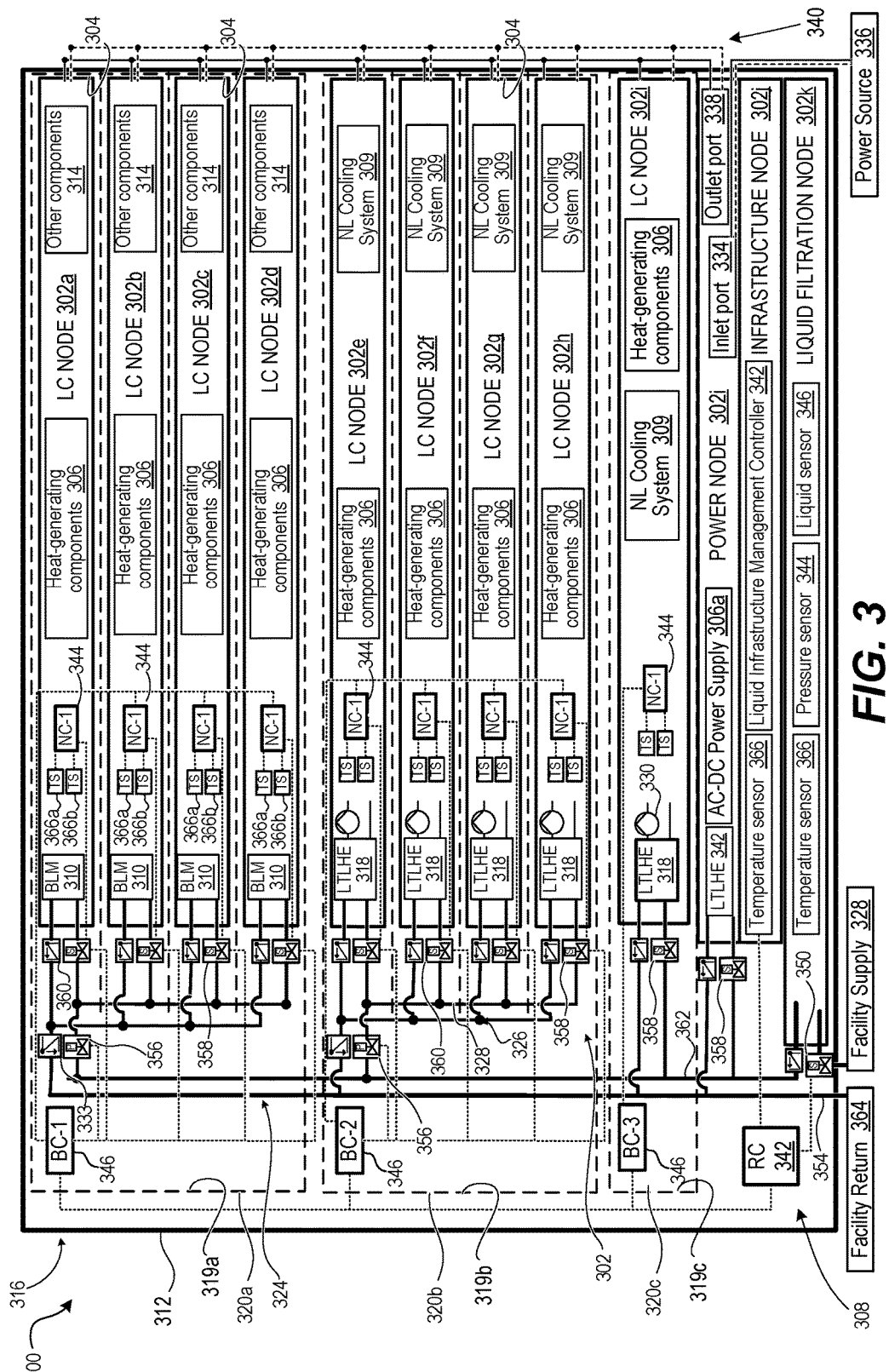
FIG. 3 illustrates a detailed block diagram of a Direct-Interface Liquid-Cooled (DL) Rack Information Handling System (RIHS) configured with LC nodes arranged in blocks and which are cooled in part by a liquid cooling system having a liquid rail comprised of Modular Liquid Distribution (MLD) conduits, and in part by block liquid manifolds for some LC nodes and in part by liquid-to-liquid heat exchangers (LTLHEs), according to multiple embodiments.

FIG. 3 depicts an example RIHS 300 having illustrative example of LC nodes 302a-302j (collectively refer to as nodes 302), with each nodes 302a-302i having a node enclosure 304 provisioned with heat-generating components 306. RIHS 300 includes a power node 302i that is also liquid cooled. Additionally, RIHS 300 also includes an infrastructure node 302j and liquid filtration node 302k, which do not necessarily include heat-generating components 306 that require liquid cooling, as the other LC nodes 302a-302i. A Direct-Interface Liquid Cooling (DL) subsystem (generally shown as being within the RIHS 300 and labelled herein as 308) can be utilized for cooling the nodes 302 via an internal node-level system 309 of conduits. In the illustrative embodiments, nodes 302a-302d receive cooling liquid from a DL subsystem 308 via block liquid manifolds (BLM) 310 that are received in a rear section of a rack 312. Additional structural features associated with the allocation of liquid flow to a BLM 310 are provided in related patent applications No. 15/016,226, filed Feb. 4, 2016, whose content has been incorporated herein by reference.

LC nodes 302a-302d include other components 314 that are not necessarily heat generating, but which are exposed to the same ambient heat conditions as the heat-generating components 306 by virtue of their location within the node enclosure 304. In one embodiment, these other components 314 can be sufficiently cooled by the direct-interface liquid cooling methodology applied to the node 302a-302d and/or using forced or convective air movement, as described later herein. Each node 302 is supported and protected by a respective node enclosure 304. Nodes 302a-302d are further received in node receiving bays 316 of a first block chassis 319a of a first block 320a. Nodes 302e-302h are received in a second block chassis 319b of a second block 320b. (Blocks 320a-320b are collectively referred to as blocks 320.) In the illustrative embodiments, the nodes 302 are vertically arranged. In one or more alternate embodiments, at least portions of the nodes 302 (and potentially all of the nodes) may also be arranged horizontally while benefiting from aspects of the present innovation.

LC nodes 302e-302i receive secondary cooling liquid from the DL subsystem 308 via a corresponding LTLHE 318 according to aspects of the present disclosure. LC nodes 302e-302h are connected to a liquid rail 324 of the RIHS 300 by MLD conduits 328. LC nodes 302e-302i include a fluid mover 330 to recirculate the first cooling liquid through the respective LTLHE 318.

The power node 302i has heat-generating components such as redundant AC-DC power supply modules 306a that are immersed for cooling in a dielectric liquid. The AC-DC power supply modules 306a receive AC power via a power node inlet port 334 from a power source 336. The AC-DC power supply modules 306a distributes DC power via a power node outlet port 338 over rack electrical distribution components 340 to other nodes 302a-302i, 302j-302k. The dielectric liquid is liquid cooled by cooling liquid from the DL subsystem 308 via a liquid-to-liquid heat exchanger (LTLHE) 342.

The present innovation is not limited to any specific number or configuration of nodes 302 or blocks 320a, 320b in a rack 312. According to one aspect, nodes 302 can be of different physical heights of form factors (e.g., 3U, 3.5U, 2U), and the described features can also be applied to nodes 302 having different widths and depths (into the rack), with some extensions made and/or lateral modifications to the placement of cooling subsystem conduits, as needed to accommodate the different physical dimensions. As a specific example, power node 302i is depicted as having a larger node enclosure 304a (with corresponding different dimensions of AC-DC power supply modules 306a) of a different number of rack units in physical height (e.g., 2U) that differs from the heights (e.g., 3U) of the other nodes 302a-102h and 302j-302k. RIHS 300 can include blocks 320 or nodes 302 selectably of a range of discrete rack units. Also, different types of Information Technology (IT) components can be provided within each node 302, with each node possibly performing different functions within RIHS 300. Thus, for example, a given node 302 may include one of a server module, a power module, a control module, or a storage module. In a simplest configuration, the nodes 302 can be individual nodes operating independent of each other, with the RIHS 300 including at least one rack-level controller (RC) 342 for controlling operational conditions within the RIHS 300, such as temperature, power consumption, communication, and the like. Each node 302 is then equipped with a node-level controller (NC) 344 that communicates with the rack-level controller 342 to provide localized control of the operational conditions of the node 302. In the more standard configuration of a DL RIHS 300, and in line with the described embodiments, RIHS 300 also includes block-level controllers (BCs) 346, communicatively coupled to the rack-level controller 342 and performing block-level control functions for the LC nodes 302 within the specific block 320. In this configuration, the nodes 302 are arranged into blocks 320, with each block 320 having one or more nodes 302 and a corresponding block-level controller 346. Note the blocks 320 do not necessarily include the same number of nodes 302, and a block 320 can include a single node 302, in some implementations.

DL subsystem 308 provides direct-interface liquid cooling to heat-generating components 306 via a liquid rail 324 under the control of the rack-level controller 342, block-level controllers 346, and/or node-level controllers 344, in some embodiments. Rack-level controller 342 controls a supply valve 350, such as a solenoid valve, to allow cooling liquid, such as water, to be received from a facility liquid supply 352. The cooling liquid is received from facility liquid supply 352 and is passed through liquid filtration node 302k before being passed through supply conduit 354 of liquid rail 324. Each block 320a, 320b receives a dynamically controlled amount of the cooling liquid via block-level dynamic control valve 356, such as a proportional valve. Return flow from each block 320a, 320b can be protected from backflow by block-level check valve 333. The individual needs of the respective nodes 302a-302d of block 320a can be dynamically provided by respective node-level dynamic control valves 358, controlled by the block-level controller 346, which control can, in some embodiments, be facilitated by the node-level controllers 344. In addition to allocating cooling liquid in accordance with cooling requirements (which can be optimized for considerations such as performance and economy), each of the supply valve 350 and/or dynamic control valves 356, 358 can be individually closed to mitigate a leak. A check valve 360 is provided between each node 302a-302h and 302j and a return conduit 362 of the liquid rail 324 to prevent a backflow into the nodes 302a-302h and 302j. The return conduit 362 returns the cooling liquid to a facility liquid return 364.

To support the temperature control aspects of the overall system, RIHS 300 includes temperature sensors 366 that are each located within or proximate to each node 302a-302k, with each temperature sensor 366 connected to the node-level controller 344 and/or the corresponding block-level controller 346. Temperature sensors 366 operate in a feedback control loop of the DL subsystem 308 to control the amount of liquid flow required to cool the nodes 302a-302h and 302j. In one or more embodiments, the rack-level controller 342 can coordinate performance constraints to block-level controllers 346 and/or node-level controllers 344 that limit an amount of heat generated by the heat-generating components 306 to match a heat capacity of the flow of cooling liquid in DL subsystem 308. Alternatively or in addition, the rack-level controller 342 can coordinate cooling levels to block-level controllers 346 and/or node-level controllers 344 that in turn control the dynamic control valves 356, 358 for absorption and transfer of the heat generated by the heat-generating components 306 by the DL subsystem 308. In one or more embodiments, support controllers such as an LIMC 368 can perform management and operational testing of DL subsystem 308. LIMC 368 can monitor pressure sensors 370 and liquid sensors 373 to detect a leak, to validate operation of a dynamic control valves 356, 358 or shutoff valves such as supply valve 350. LIMC 368 can perform close-loop control of specific flow rates within the RIHS 300.

Temperature monitoring controls are provided to ensure that sufficient volume and flow rate of cooling liquid are provided to properly cool any exhaust air and maintain node 302 at a desired operating temperature (or within a desired operating temperature range). In one embodiment, the temperature and volume of cooling liquid from the facility liquid supply 350 is determined based on measurements and testing and/or empirical calculations to provide adequate cooling for the operational requirements of the RIHS 300. In one or more embodiments, at least the volume of the cooling liquid is dynamically controlled to more closely approximate the cooling requirements of RIHS 300 and/or at least any air-cooled node 302j at a given time. In the illustrative embodiment, a first temperature sensor 366a is positioned to detect an air temperature of a selected one of an air intake and air exhaust of a node 302. Second temperature sensor 366b is positioned to detect an air temperature within the node 302. LIMC 368 is in communication with first and second temperature sensors 366a, 366b and with dynamic control valve 356 and LIMC 368 can dynamically adjust a volume of cooling liquid based at least in part on a difference between the detected air temperatures.

In at least one alternate embodiment, LIMC 368 is coupled to and receives the detected temperature readings from a node controller and/or a block controller that in turn is coupled to first temperature sensor 366a and second temperature sensor 366b. LIMC 368 and/or one of the other controllers generates a control signal that is sent to a pulse width modulation (PWM) circuit (not shown), which is coupled to dynamic control valve 356. In response to receipt of the control signal, PWM circuit in turn generates a PWM signal that can control the open position of dynamic control valve 356. The PWM signal adjusts the open position of dynamic control valve 356, and the open position of the valve determines (and can be used to regulate) the amount (or rate) of cooling liquid that flows through dynamic control valve 356. For rack-level valve control, LIMC 368 triggers a specific value of the PWM signal based on a rack level determination that can include consideration of available (un-allocated or reclaimed) volume of liquid flow across the RIHS 300 and other factors. LTLHE 318 can be configured as a single node LTLHE or a block level LTLHE supporting multiple adjacent nodes within a block chassis 319 of RIHS 300, and the flow control aspects described as being provided by LIMC 368 can also be provided by a block level controller, in one or more embodiments. Additional control features associated with the allocation of liquid flow to LTLHE 318 are provided in related patent applications No. 15/017,604, filed Feb. 6, 2016 and No. 15/017,451, filed Feb. 5, 2016, whose content are incorporated herein by reference.

Figure 4:
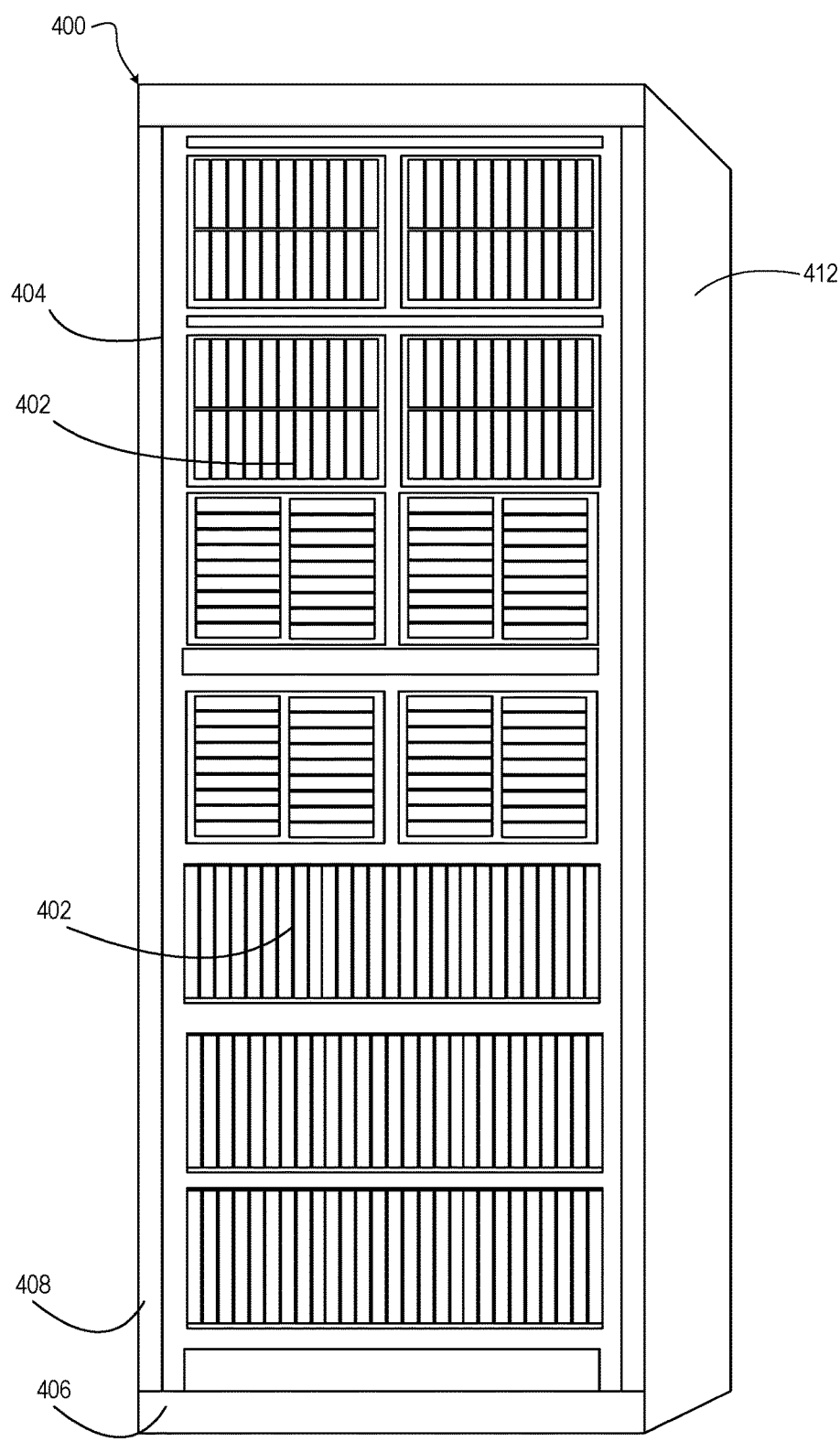
FIG. 4 illustrates a front perspective view of an example DL RIHS, according to one or more embodiments.
Figure 5:
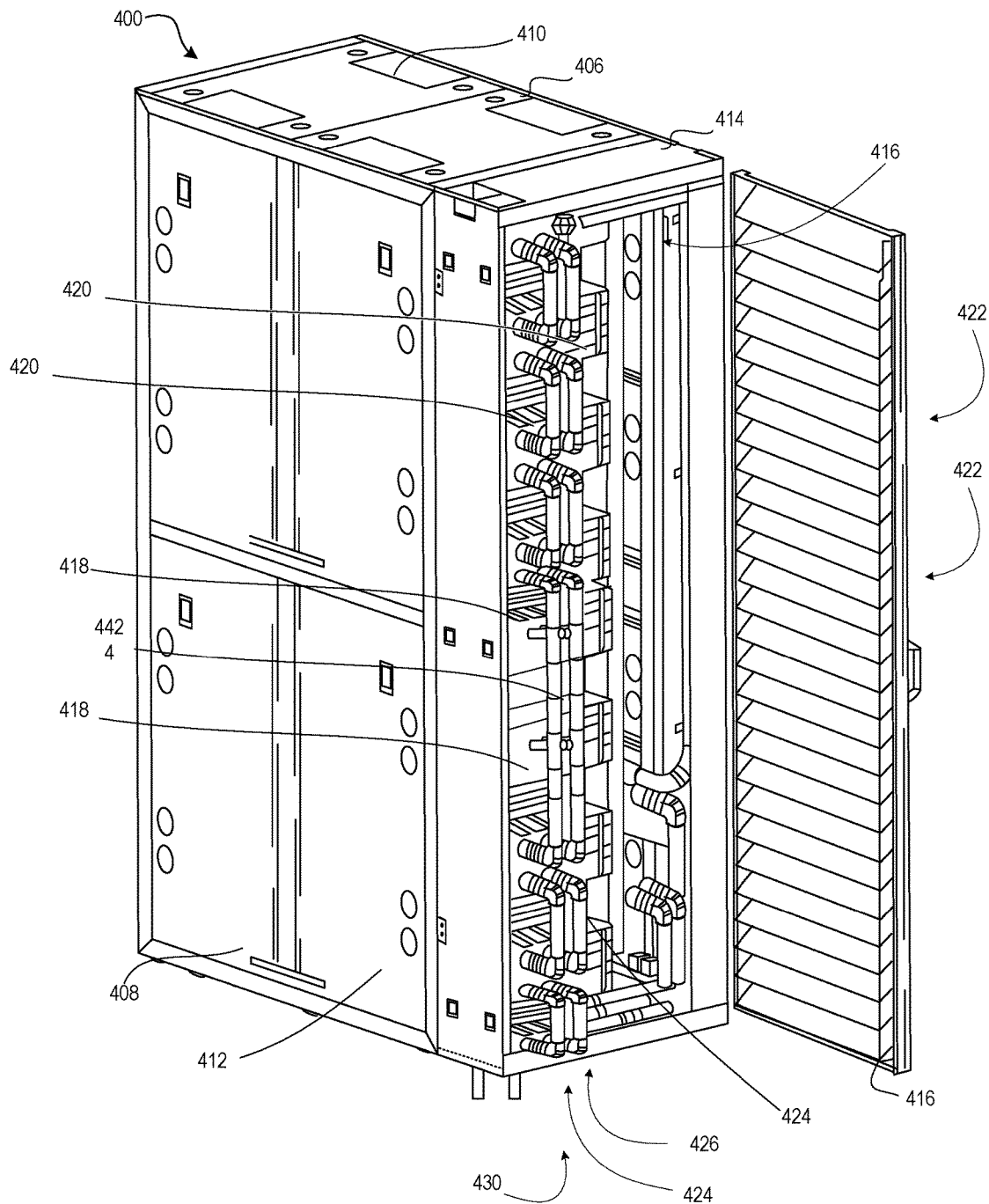
FIG. 5 illustrates a rear perspective view of the example DL RIHS of FIG. 4 with a louvered rear door in an open position to expose an example liquid rail, according to one or more embodiments.

FIGS. 4-5 illustrate a DL RIHS 400 that receives LC nodes 402 (FIG. 4) from a front side 404 of a rack 406 having a rack enclosure 408 formed in part by a top panel 410 (FIG. 5), side panels 412, and a bottom panel (not shown). FIG. 5 illustrates a rear section 414 of the rack enclosure 408 that is accessible via a louvered door 416. LTLHE 418 and block liquid manifolds 420 support respective node-receiving bays 422. Modular Liquid Distribution (MLD) conduits 424 form a supply conduit 426 and a return conduit 428 of a liquid rail 430.

Figure 6:
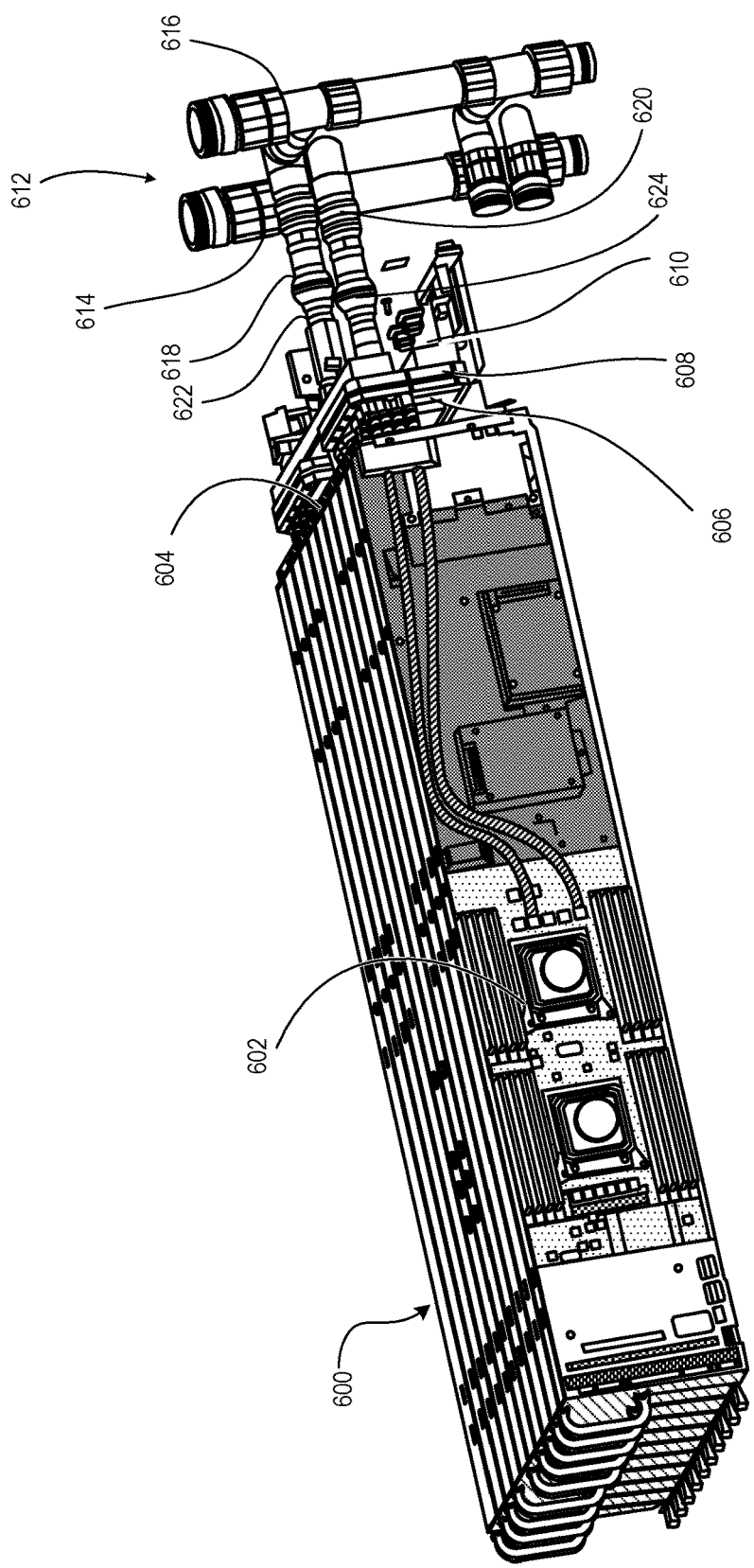
FIG. 6 illustrates a right side perspective view of the example block of LC nodes and a corresponding LTLHE configured for open-loop cooling liquid distribution, according to one or more embodiments.
Figure 7:
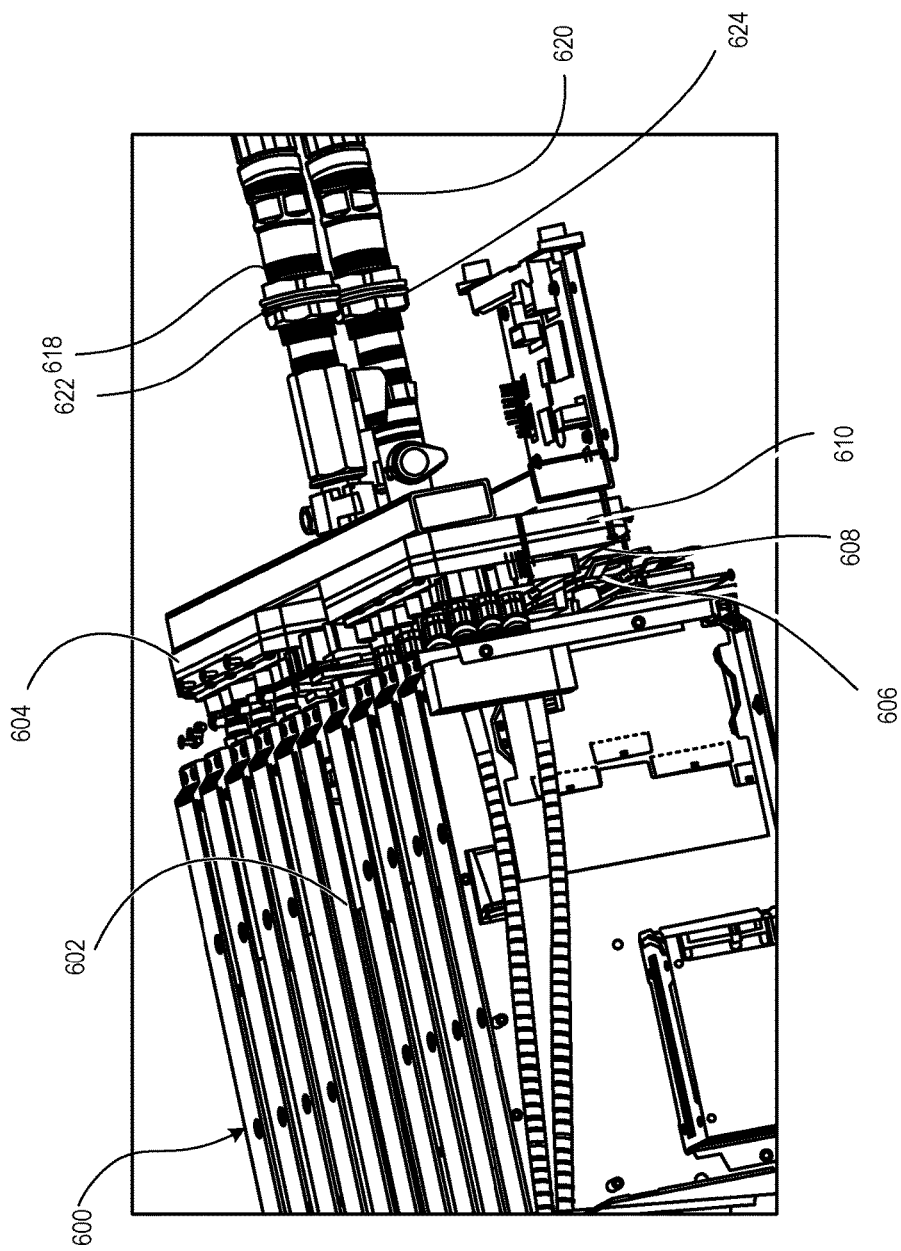
FIG. 7 illustrates a perspective detail view of the LTLHE of FIG. 6, according to one or more embodiments.
Figure 8:
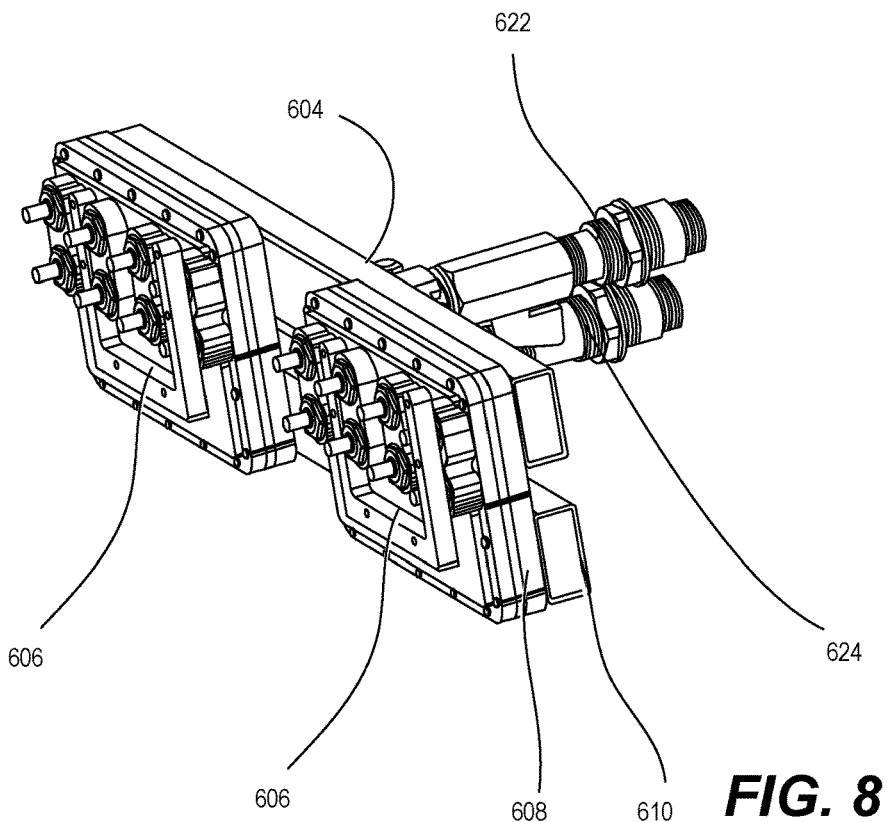
FIG. 8 illustrates a right side perspective view of the assembled LTLHE of FIG. 6, according to one or more embodiments.
Figure 9:
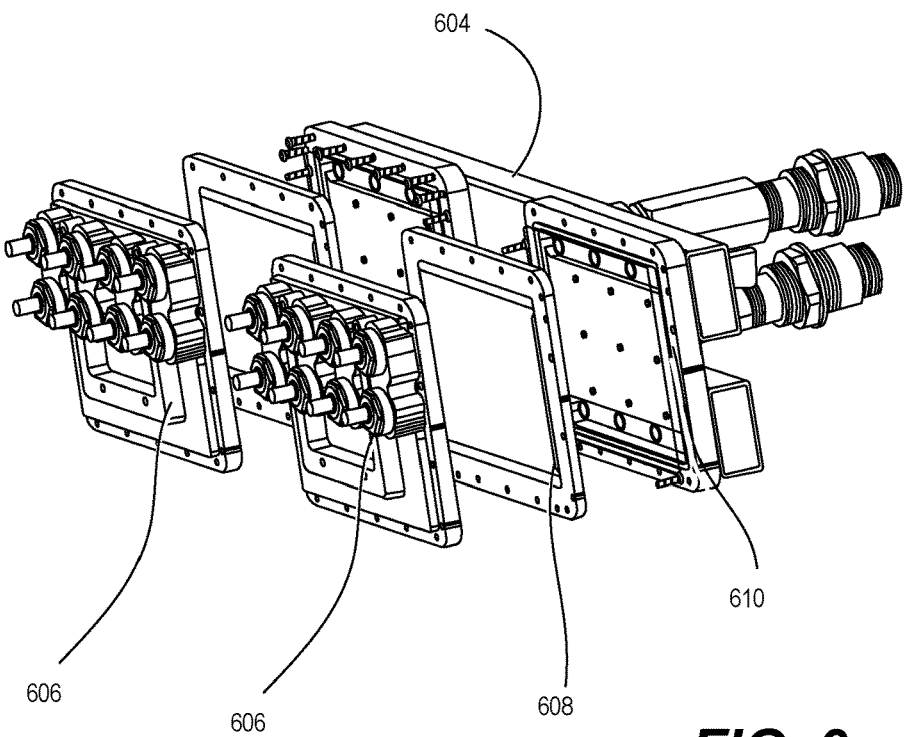
FIG. 9 illustrates a right side perspective view of a disassembled LTLHE of FIG. 6, according to one or more embodiments.
Figure 10:
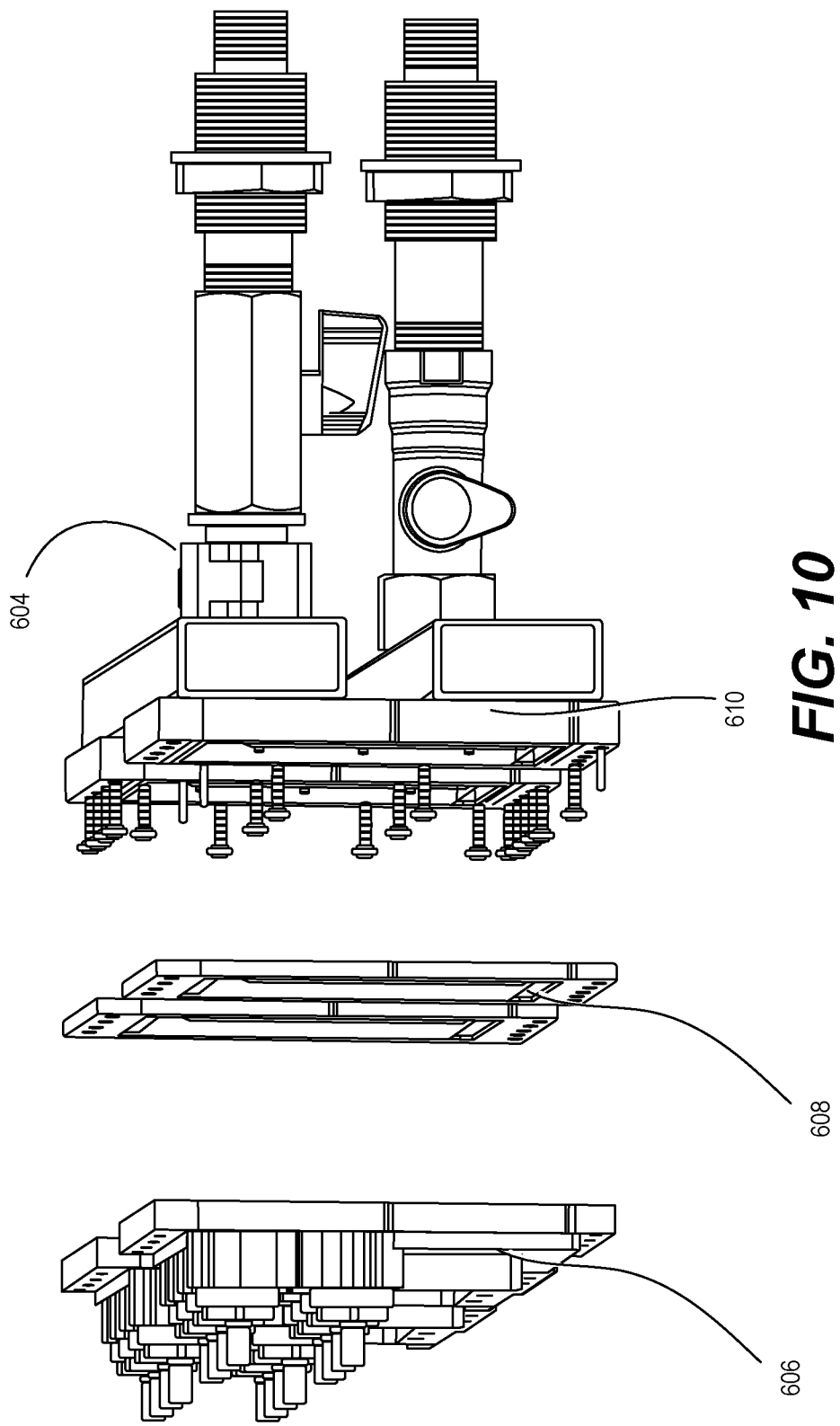
FIG. 10 illustrates a right side view of the disassembled LTLHE of FIG. 9, according to one or more embodiments.

FIGS. 6-7 illustrate an example block 600 of LC nodes 602 that are sealingly engaged to a LTLHE 604. FIGS. 6-10 illustrate that the LTLHE 604 includes a first liquid manifold 606, a transfer plate 608, and a second liquid manifold 610 In one or more embodiments, a liquid rail 612 include supply and return conduits 614, 616 that linearly attach to each other. Centerline supply and return hose connections 618, 620 of the supply and return conduits 614, 616 attach to supply and return connections 622, 624 of the LTLHE 604.

Figure 11:
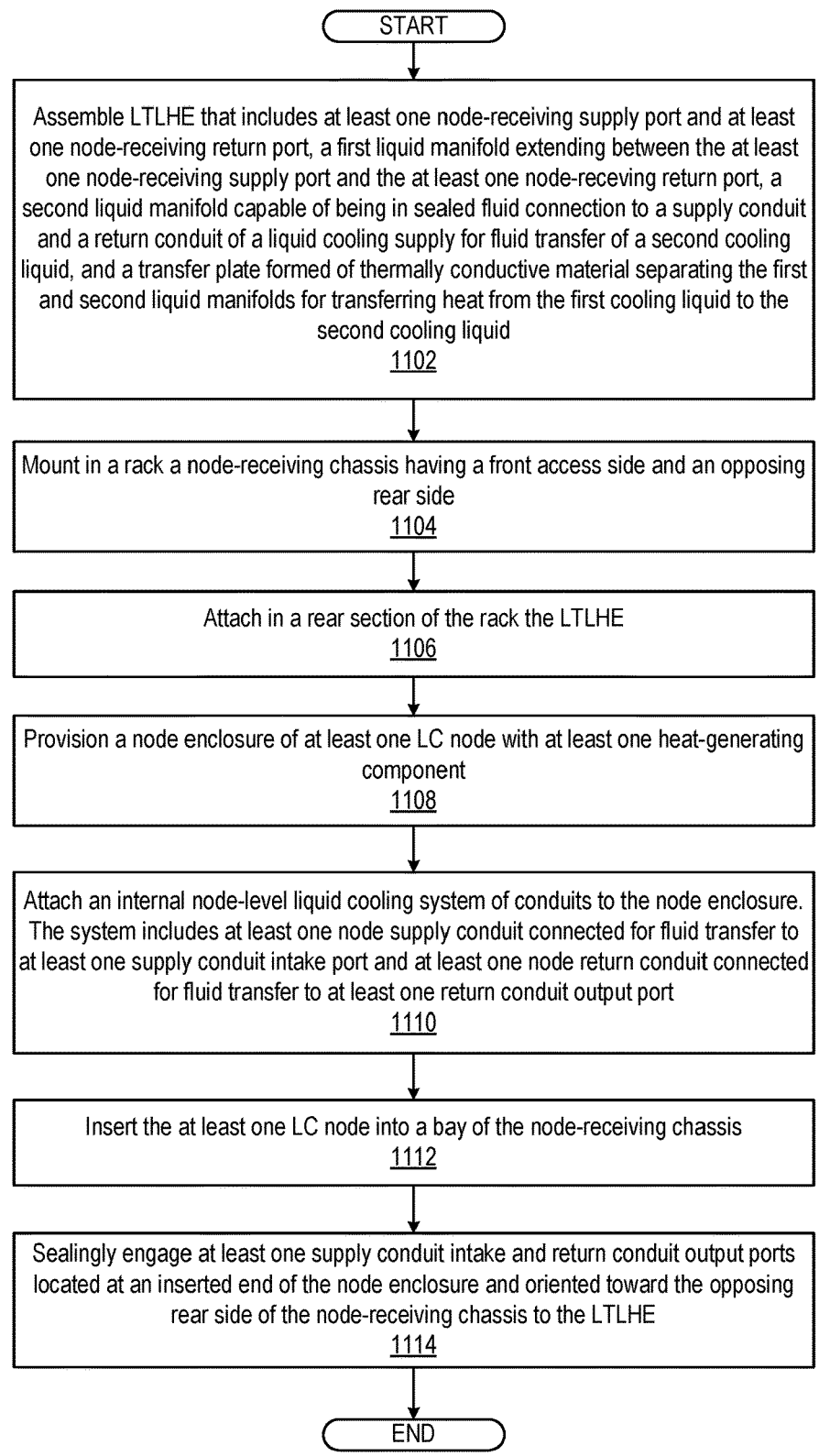
FIG. 11 illustrates a flow diagram of a method of assembling a DL RIHS that utilizes LTLHEs for cooling LC nodes, according to one or more embodiments.

FIG. 11 illustrates a method 1100 of assembling an RIHS that utilizes LTLHEs to cool LC nodes. In one or more embodiments, the method 1100 includes assembling the LTLHE that includes at least one node-receiving supply port and at least one node-receiving return port. The LTLHE includes a first liquid manifold extending between the at least one node-receiving supply port and the at least one node-receiving return port. The LTLHE includes a second liquid manifold capable of being in sealed fluid connection to a supply conduit and a return conduit of a liquid cooling supply for fluid transfer of a second cooling liquid. The LTLHE includes a transfer plate formed of thermally conductive material separating the first and second liquid manifolds for transferring heat from the first cooling liquid to the second cooling liquid (block 1102). The method a flow diagram of a method of assembling a DL RIHS, according to one or more embodiments 1100 includes mounting in a rack a node-receiving chassis having a front access side and an opposing rear side (block 1104). The method 1100 includes attaching in a rear section of the rack the LTLHE (block 1106). The method 1100 includes provisioning a node enclosure of at least one LC node with at least one heat-generating component (block 1108). The method 1100 includes attaching an internal node-level liquid cooling system of conduits to the node enclosure. The system includes at least one node supply conduit connected for fluid transfer to at least one supply conduit intake port and at least one node return conduit connected for fluid transfer to at least one return conduit output port (block 1110). The method 1100 includes inserting the at least one LC node into a bay of the node-receiving chassis (block 1112). The method 1100 includes sealingly engaging at least one supply conduit intake and return conduit output ports located at an inserted end of the node enclosure and oriented toward the opposing rear side of the node-receiving chassis to the LTLHE (block 1114). The sealing engagement enables receipt of a first cooling liquid at a first temperature and return of the first cooling liquid at an increased temperature due to heat absorption within the node enclosure. Then method 1100 ends.

Figure 12:
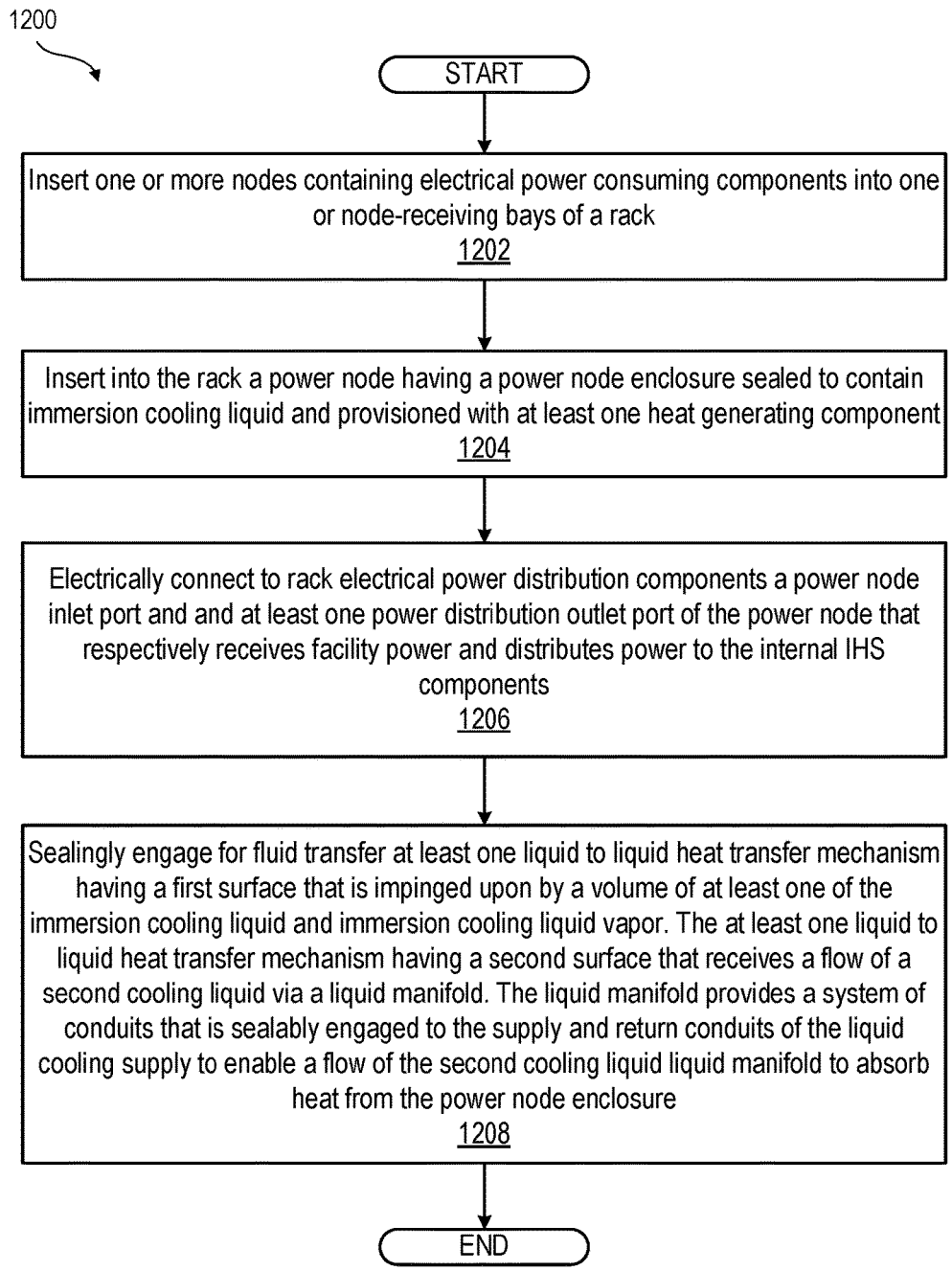
FIG. 12 illustrates a flow diagram of a method of assembling a DL RIHS that utilizes an immersion-cooled power node, according to one or more embodiments.

FIG. 12 illustrates method 1200 of assembling an RIHS that utilized an immersion-cooled power node. In one or more embodiments, the method 1200 includes inserting one or more nodes containing electrical power consuming components into one or node-receiving bays of a rack (block 1202). The method 1200 includes inserting into the rack a power node having a power node enclosure sealed to contain immersion cooling liquid and provisioned with at least one heat generating component (block 1204). The method 1200 includes electrically connecting to rack electrical power distribution components a power node inlet port and at least one power distribution outlet port of the power node that respectively receives facility power and distributes power to the internal IHS components (block 1206). The method 1200 includes sealingly engaging for fluid transfer at least one liquid to liquid heat transfer mechanism having a first surface that is impinged upon by a volume of at least one of the immersion cooling liquid and immersion cooling liquid vapor. The at least one liquid to liquid heat transfer mechanism having a second surface that receives a flow of a second cooling liquid via a liquid manifold. The liquid manifold provides a system of conduits that is sealably engaged to the supply and return conduits of the liquid cooling supply to enable a flow of the second cooling liquid manifold to absorb heat from the power node enclosure (block 1208). Then method 1200 ends.

In the above described flow chart of FIGS. 11-12, the methods may be embodied in an automated manufacturing system that performs a series of functional processes. In some implementations, certain steps of the method are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

RIHS receives high voltage AC (VAC) that is power converted down to a 12 volt DC (VDC) power by Power Supply Units (PSUs) within a Power Distribution Unit (PDU). The PSUs bridges the data center supply power to the type of power required by IT equipment within the RIHS. This power conversion creates a tremendous amount of heat. The amount of power that can be supplied by a Power Supply Unit (PSU) is limited by its ability to be cooled. Today, Direct Current Supply (DCS) is limited to 2000 W maximum power from each PSU. Generally-known RIHSes include PSUs that are mounted to a rack in a server bay. For example, a generally-known RIHS can include 400V/240 VAC 3-phase data center input power strip. A particular outlet of the power strip provides 240 VAC 1-phase Power Distribution Unit (PDU) power output via electrical power cables to one server PSU of three server PSUs inserted in PSU bays of a server-sized PSU chassis.

Figure 13:
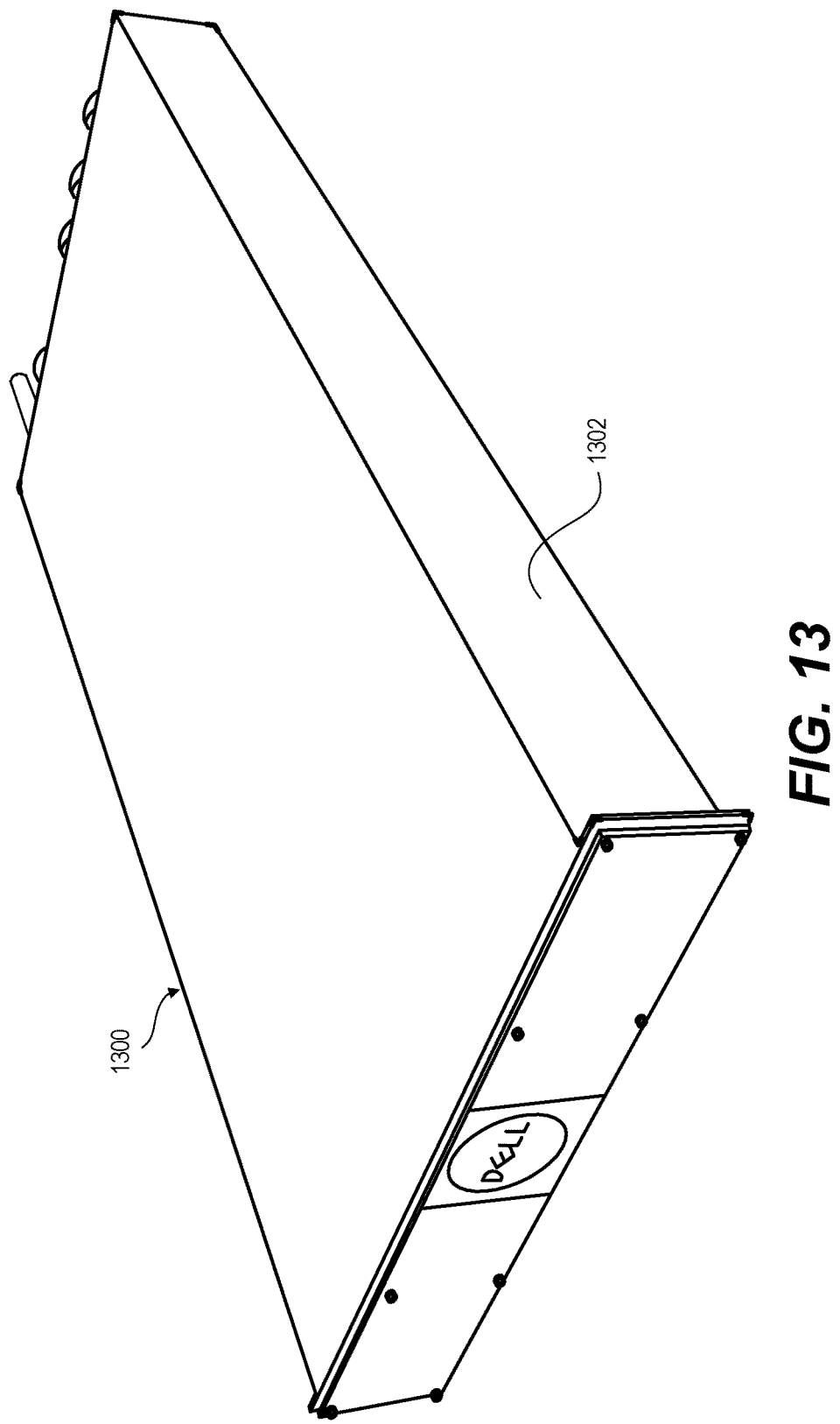
FIG. 13 illustrates a front-angled perspective view of an immersion Power Distribution Unit (PDU), according to one or more embodiments.
Figure 14:
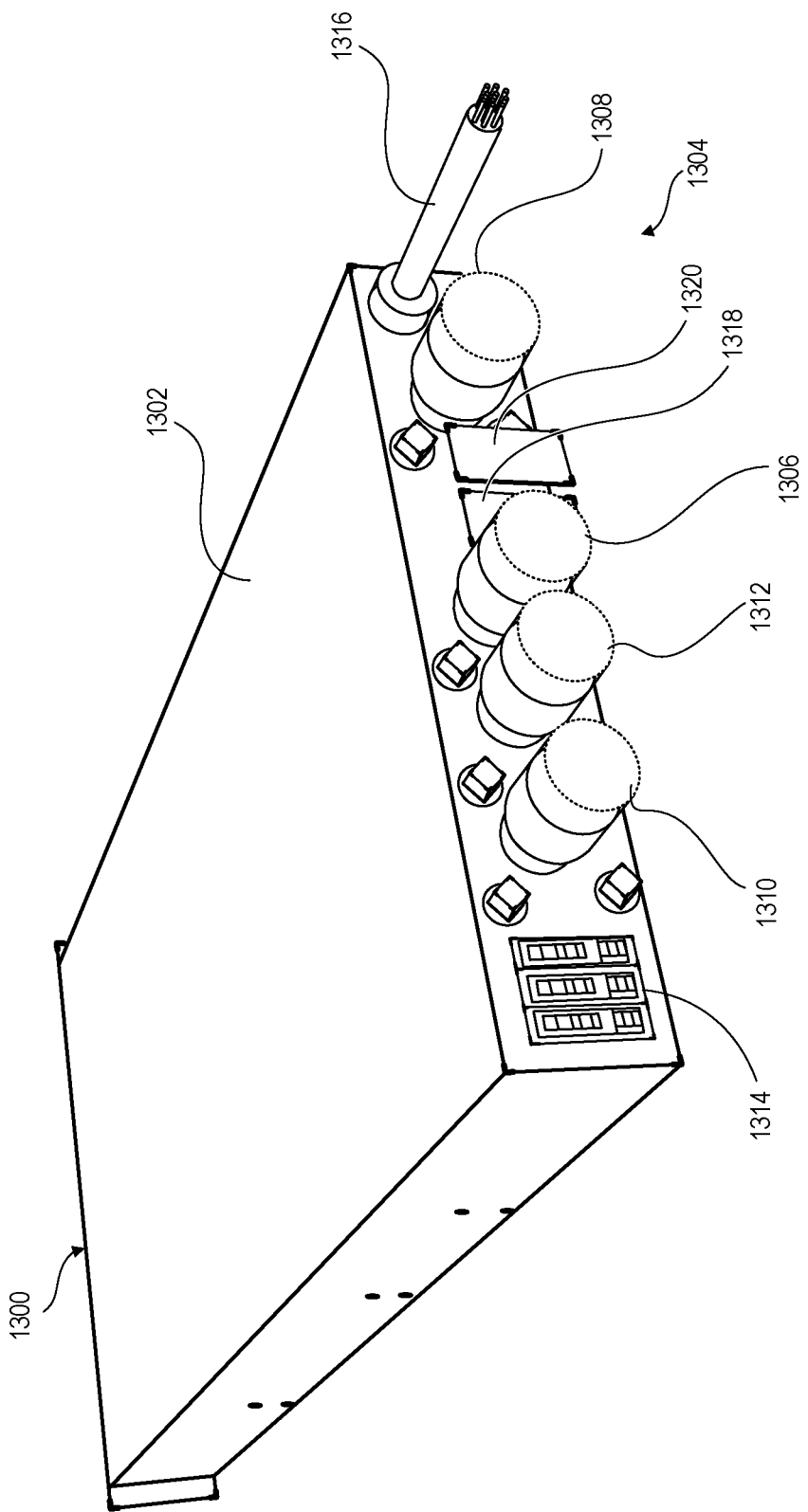
FIG. 14 illustrates a rear perspective view of the immersion PDU of FIG. 13, according to one or more embodiments.
Figure 15:
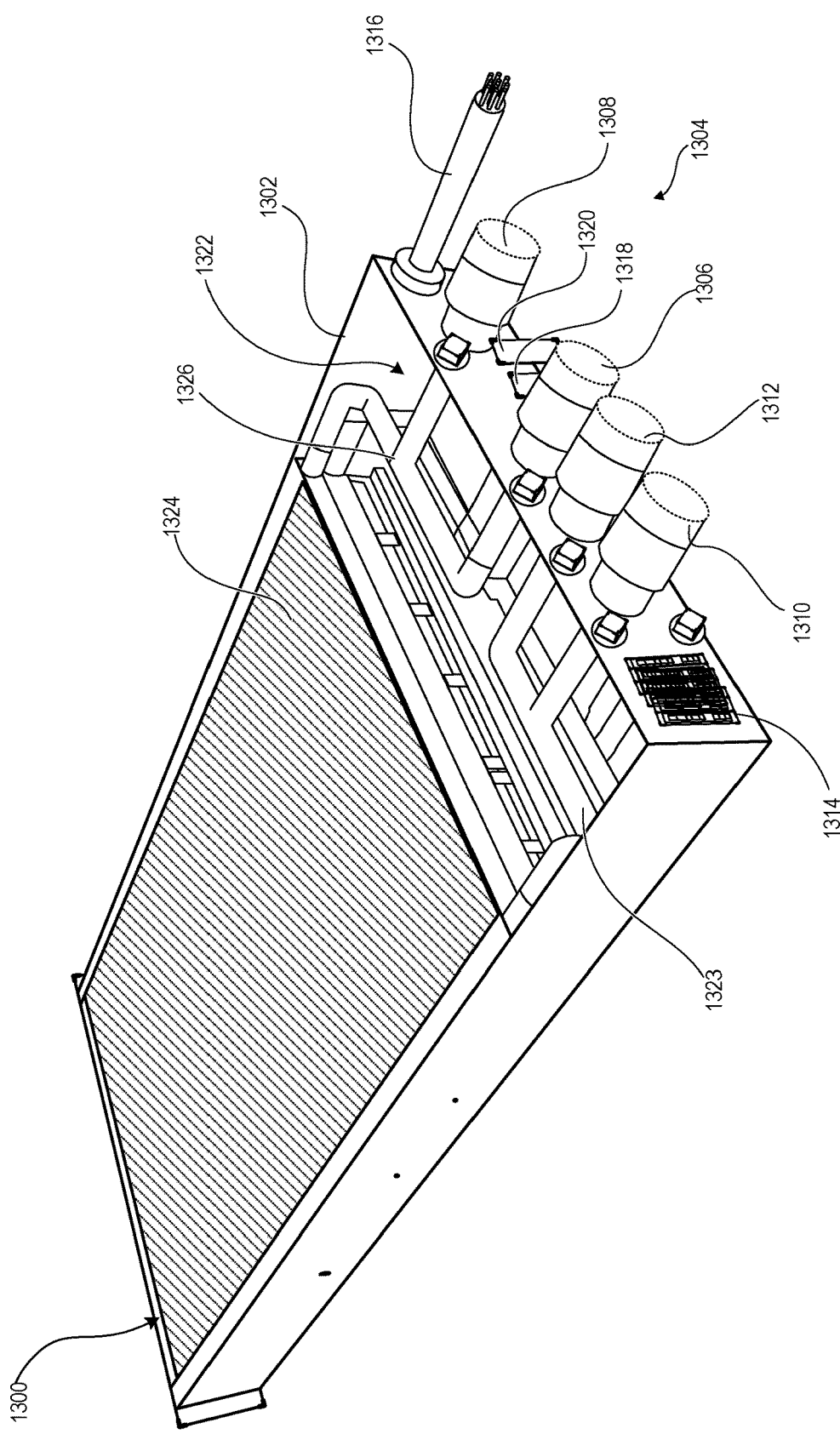
FIG. 15 illustrates a rear perspective view of the immersion PDU of FIG. 13 with a top panel removed to expose a liquid-to-liquid heat exchanger and supply piping, according to one or more embodiments.

FIG. 13 illustrates an immersion PDU 1300 having a PDU chassis 1302 that is rack-unit dimensioned to be received in a server slot or bay of the RIHS 400 (FIG. 4). FIG. 14 illustrates immersion PDU 1300 having liquid cooling and electrical interfaces on a back side 1304 of PDU chassis 1302. Liquid cooling interfaces include left and right liquid supply connections 1306, 1308 with a bypass feature. Liquid cooling interfaces include left and right liquid return connections 1310, 1312 with a bypass feature. Electrical interfaces include three-phase (x, y, z) circuit breakers 1314, an electrical cable 1316 that provides data center input power (e.g., 480 VAC), and positive and negative direct current (DC) bus bars 1318, 1320 that provide server output power (e.g., 12 VDC) that can be distributed to multiple servers (i.e., functional nodes requiring power) of the RIHS 400 (FIG. 4). FIG. 15 illustrates that the PDU chassis 1302 forms a sealed enclosure that contains a dielectric liquid 1322. The dielectric liquid can be water and/or can be oil or some other liquid that is able to absorb a large amount of heat and quickly release that heat to a cooling source, such as a condenser or radiator. The cooling liquid received from the liquid supply connections 1306, 1308 is kept separate from the dielectric liquid. The cooling liquid is directed through supply conduits 1323 to pass through a radiator 1324 that absorbs and removes heat from the dielectric liquid 1322. The warmed cooling liquid is directed from the radiator 1324 through return conduits 1326 to the liquid return connections 1310, 1312.

Figure 16:
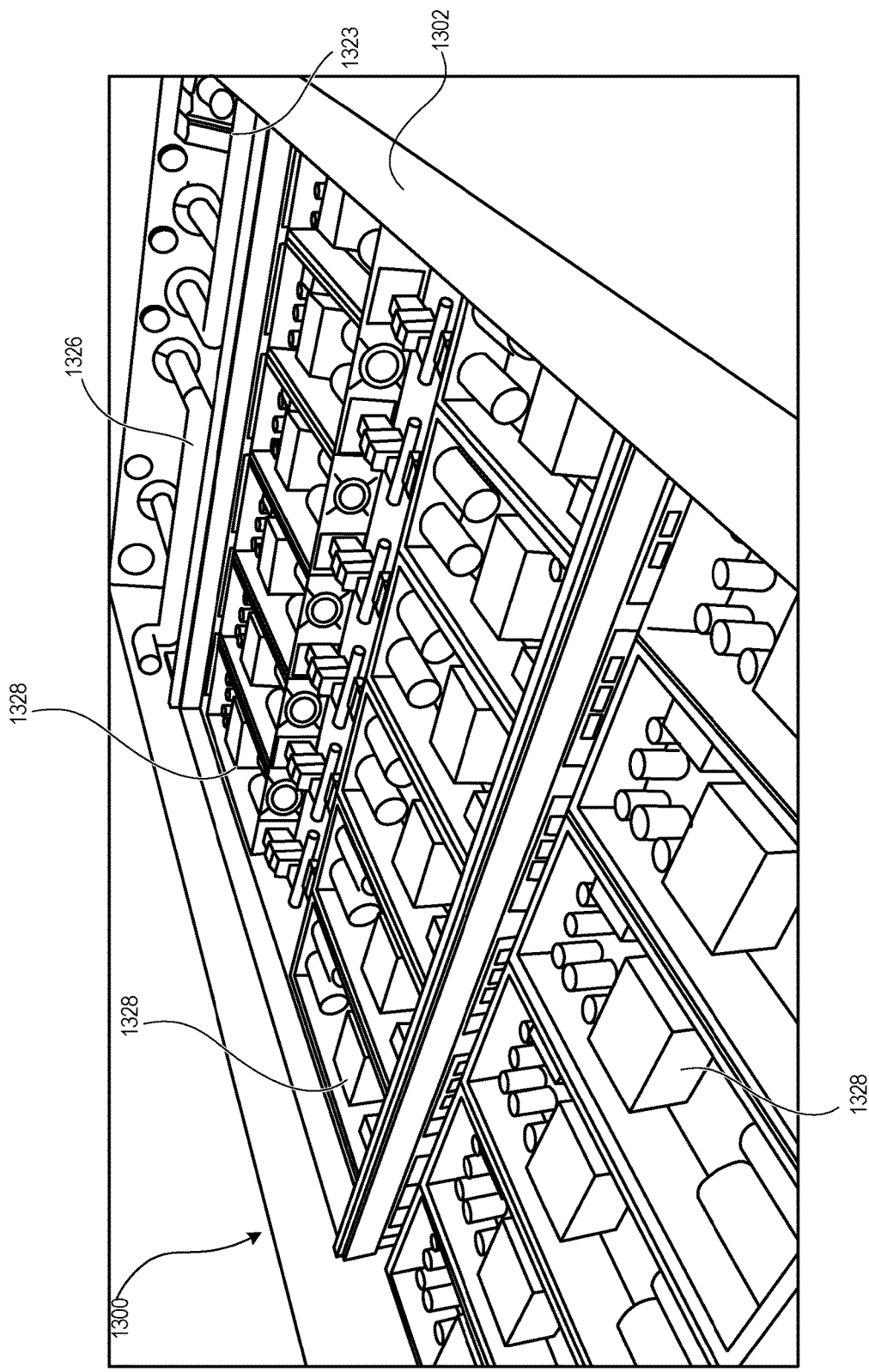
FIG. 16 illustrates a top perspective view of the immersion PDU of FIG. 15, with a top panel and heat exchanger removed to expose the internal power devices, according to one or more embodiments.
Figure 17:
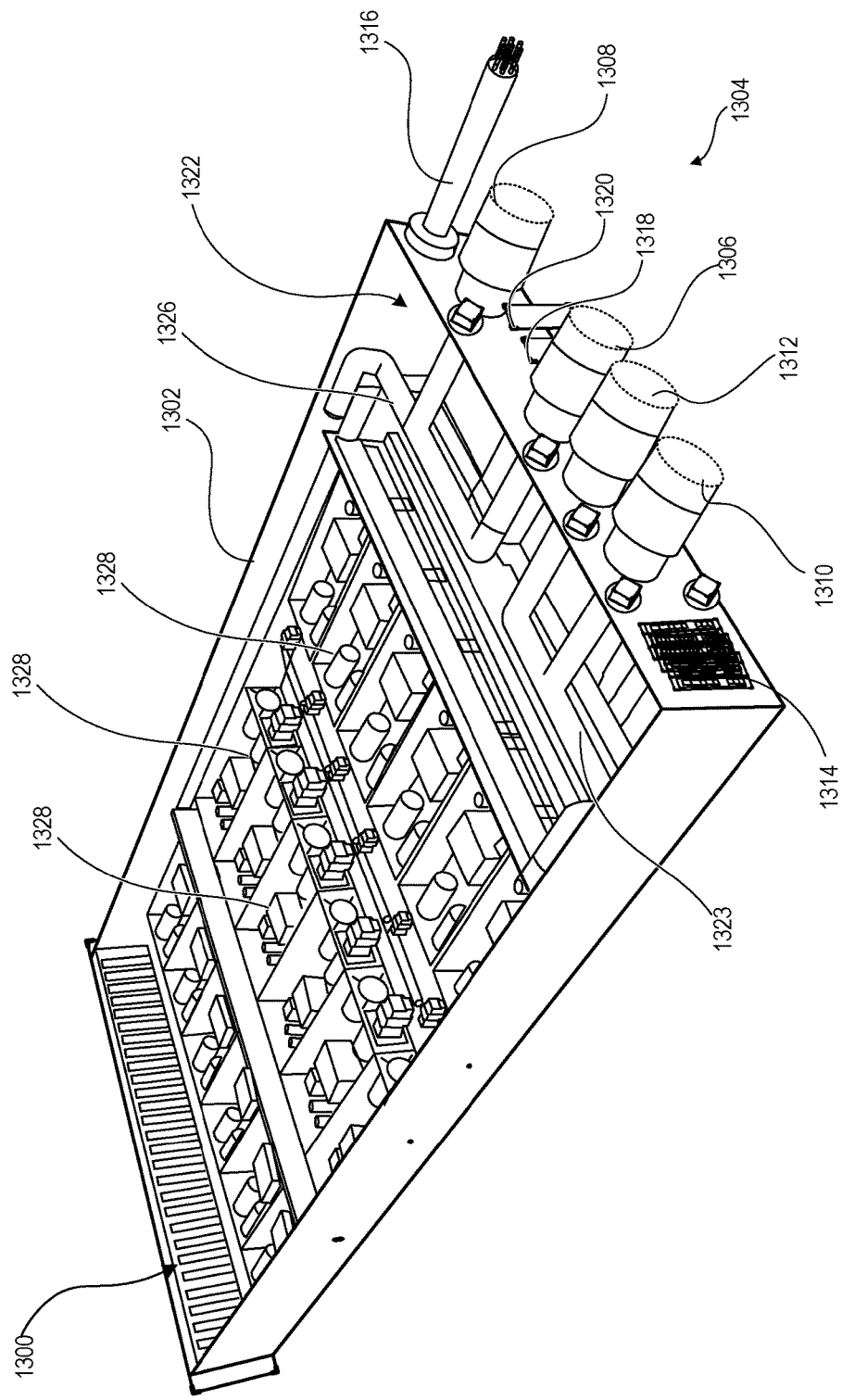
FIG. 17 provides a second internal view of the power devices and supply piping of the immersion PDU of FIG. 16, with a rear panel having a main power supply connector and power distribution outlets, and supply and return connectors embedded therein, according to one or more embodiments.
Figure 18:
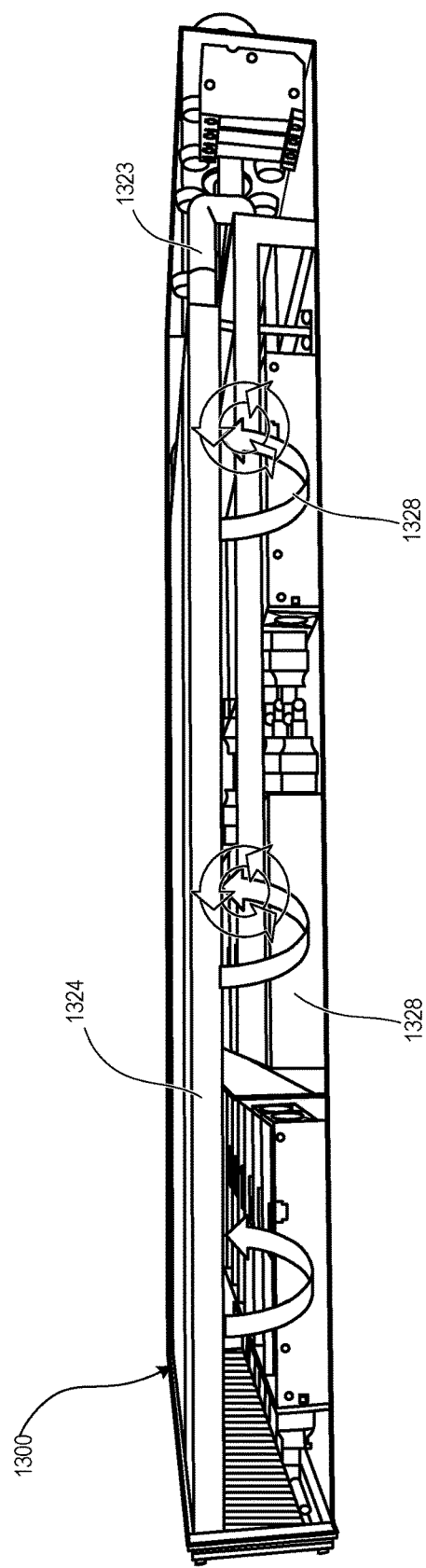
FIG. 18 is a side cross-sectional view of the immersion PDU of FIG. 13, with cooling fluid convection loops illustrated by arrows, according to one or more embodiments.

FIGS. 16-18 illustrate examples in which immersion PDU 1300 supports eighteen (18) server PSUs 1328 that are immersed in the dielectric liquid 1322 within the PDU chassis 1302. The dielectric liquid 1322 is electrically non-conductive and can have roughly one thousand times the cooling capacity per unit of volume than air. In one embodiment, each server PSU 1328 converts 240 VAC to 12 VDC used by functional computing components in the RIHS. With the cooling benefit of the immersion PDU 1300, each server PSU 1328 can operate at 3000 W for a total of 54,000 Watts maximum DC power output in the same volumetric footprint as generally-known PSUs without immersion cooling. FIG. 18 illustrates thermal flow within the immersive PDU 1300. As heat is dissipated from the immersed PSUs 1328, heat causes the local fluid (dielectric liquid 1322) to expand, decrease density, and rise to the top of the enclosure (PDU chassis 1302) due to free convection flow. The radiator 1324 at the top of the enclosure can use water from a facility cooling loop as a cooling liquid to absorb the heat from the dielectric liquid 1322. According to one aspect, the process of heat removal can involve single phase heat transfer (i.e., dielectric liquid to cooling liquid) or dual phase heat transfer (i.e., liquid to gas and back to liquid). The nature of the heat transfer (e.g., single phase versus dual phase) can depend on the amount of heat being absorbed by the dielectric liquid from the heat generating power components. As the dielectric liquid 1322 cools, from being in contact with the embedded radiator 1324 providing the flow of cooling liquid flow and the exterior surface to facilitate heat transfer, the density of the cooled fluid (liquid or gas) increases, and the cooler liquid sinks to the bottom of the enclosure via free convection cooling. According to one aspect, the enclosure is passive, requiring no pumps or fans.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An Information Handling System (IHS) comprising:
   a node-receiving chassis having a front access side and an opposing rear side;
   at least one liquid cooled (LC) node inserted into a bay of the node-receiving chassis, the LC node including a node enclosure provisioned with at least one heat-generating component and an internal node-level liquid cooling system of conduits comprising at least one node supply conduit connected for fluid transfer to at least one supply conduit intake port and at least one node return conduit connected for fluid transfer to at least one return conduit output port, the at least one supply conduit intake and return conduit output ports located at an inserted end of the node enclosure and oriented toward the opposing rear side of the node-receiving chassis respectively enabling receipt of a first cooling liquid at a first temperature and return of the first cooling liquid at an increased temperature due to heat absorption within the node enclosure; and
   a liquid-to-liquid heat exchanger (LTLHE) positioned towards the rear side of the node-receiving chassis and comprising:
      at least one node-receiving supply port and at least one node-receiving return port oriented facing the opposing rear side of the chassis to enable sealed engagement, for first cooling liquid transfer, to the at least one supply conduit intake port and from the at least one return conduit output port of the at least one LC node;
      a first liquid manifold extending between the at least one node-receiving supply port and the at least one node-receiving return port, the first liquid manifold being in sealed fluid connection to the intake and output ports of the node-level liquid cooling system of conduits to provide a first liquid cooling loop for continuous flow of the first liquid through the at least one LC node and through the first liquid manifold;
      a second liquid manifold capable of being in sealed fluid connection to a supply conduit and a return conduit of a liquid cooling supply for fluid transfer of a second cooling liquid; and
      a transfer plate formed of thermally conductive material separating the first and second liquid manifolds for transferring heat from the first cooling liquid to the second cooling liquid;
   wherein the supply conduit and the return conduit of the liquid cooling supply respectively routes a directional flow of a second cooling liquid when the supply conduit is connected to a liquid supply, wherein a rack-level liquid cooling supply is a part of a rack-level cooling system having a cooling rail comprised of Modular Liquid Distribution (MLD) conduits, where the supply conduit and the return conduit are respectively provided via respective supply and return MLD conduits, which sealably attach to corresponding supply and return ports of the second liquid manifold.

2. The IHS of claim 1, wherein the node intake and output ports comprise multiple conduit connection affordances located at a rear of the node enclosure to enable sealed connection to the node-receiving supply and return ports of the first liquid manifold.

3. The IHS of claim 1, wherein the node intake and output ports comprise a selected one of a male and a female quick connect couplings and the node-receiving supply and the return ports comprise corresponding one of a female and a male quick connect couplings, wherein the male and female quick connect couplings engageably mate and seal when brought together to allow for fluid transfer and are configured to automatically shutoff fluid passage in response to disengagement.

4. The IHS of claim 1, wherein the node enclosure further comprises a pump attached to the liquid cooling system of conduits and which pushes the first cooling liquid through the first cooling loop.

5. The IHS of claim 4, the LC node further comprising a cold plate placed in conductive contact with at least one heat generating component and over which liquid flow is directed via the system of conduits to enable absorption of heat from the cold plate.

6. The IHS of claim 1, further comprising a rack having one or more chasses for receiving nodes, wherein the LTLHE is received in a rear section of the rack and the supply conduit and the return conduit of the liquid cooling supply are provided at the rear section of the rack.

7. The IHS of claim 6, further comprising a power node received in a power node-receiving bay of the rack, the power node comprising:
  a power node enclosure sealed to contain immersion cooling liquid and provisioned with at least one heat generating component that receives and distributes electrical power for use by other nodes within the IHS;
  a power node inlet port and at least one power distribution outlet port that respectively receives facility power and distributes power to internal IHS components; and
  at least one liquid to liquid heat transfer mechanism having a first surface that is impinged upon by a volume of at least one of the immersion cooling liquid and immersion cooling liquid vapor and a second surface that receives a flow of a second cooling liquid via a liquid manifold providing a system of conduits that is sealably engage to the supply and return conduits of the liquid cooling supply to enable a flow of the second cooling liquid manifold to absorb heat from the power node enclosure.

8. The IHS of claim 7, wherein:
the power node further comprises redundant AC-to-DC power supply modules;
the immersion cooling liquid comprises a liquid dielectric coolant;
the power node inlet port comprises an AC input; and
at least one power distribution outlet port comprises a DC output.

9. The IHS of claim 1, wherein the LTLHE comprises:
a supply bypass tube and a return bypass tube; and
a dynamic control valve that directs a portion of cooling liquid from the supply bypass tube through the LTLHE and to the return bypass tube;
the IHS further comprising one or more liquid cooling manifolds correspond to one or more LC nodes arranged in the rack where each liquid cooling manifolds includes a supply bypass tube and a return bypass tube connected to another adjacent node by MLD conduits, wherein a plurality of MLD conduits connected across a plurality of nodes form a liquid rail.

10. The IHS of claim 9, wherein the one or more or more liquid cooling manifolds comprises a selected one or more of: an LTLHE; a block liquid manifold that supplies direct-interface liquid cooling to the corresponding one or more LC nodes; and an ATLHE that cools exhaust air from corresponding air cooled one or more nodes.

11. The IHS of claim 9, wherein the supply and return ports of the second liquid manifold of the LTLHE each comprise a selected one of a male and a female quick connect couplings and the MLD conduits comprise corresponding one of a female and a male quick connect couplings, wherein the male and female quick connect couplings engageably mate and seal when brought together to allow for fluid transfer and are configured to automatically shutoff fluid passage in response to disengagement.

12. The IHS of claim 9, wherein the second liquid manifold comprises heat exchanger intake connection and output ports comprise a selected one of a male and a female quick connect couplings and the node-receiving supply and the return ports comprise corresponding one of a female and a male quick connect couplings, wherein the male and female quick connect couplings engageably mate and seal when brought together to allow for fluid transfer and are configured to automatically shutoff fluid passage in response to disengagement.

13. The IHS of claim 1, wherein the at least one LC node comprises a power node received in a node-receiving bay of the rack, the power node comprising:
  a power node enclosure sealed to contain immersion cooling liquid and provisioned with at least one heat generating component that receives and distributes electrical power for use by other nodes within the IHS; and
  a power node inlet port and at least one power distribution outlet port that respectively receives facility power and distributes power to the internal IHS components.

14. A Rack Information Handling System (RIES) comprising:
  a rack having one or node-receiving bays;
  a liquid-to-liquid heat exchanger (LTLHE) received in a rear section of the rack, the LTLHE comprising:
    at least one node-receiving supply port and at least one node-receiving return port;
    a first liquid manifold extending between the at least one node-receiving supply port and the at least one node-receiving return port;
    a second liquid manifold capable of being in sealed fluid connection to a supply conduit and a return conduit of a liquid cooling supply for fluid transfer of a second cooling liquid; and
    a transfer plate formed of thermally conductive material separating the first and second liquid manifolds for transferring heat from the first cooling liquid to the second cooling liquid; and
  a node-receiving chassis having a front access side and an opposing rear side and having a bay configured to receive an inserted at least one liquid cooled (LC) node including a node enclosure provisioned with at least one heat-generating component and an internal node-level liquid cooling system of conduits comprising at least one node supply conduit connected for fluid transfer to at least one supply conduit intake port and at least one node return conduit connected for fluid transfer to at least one return conduit output port, the at least one supply conduit intake and return conduit output ports located at an inserted end of the node enclosure and oriented toward the opposing rear side of the node-receiving chassis to sealing engage for fluid transfer respectively at least one node-receiving supply port and at least one node-receiving return port enabling receipt of a first cooling liquid at a first temperature and return of the first cooling liquid at an increased temperature due to heat absorption within the first liquid manifold;

wherein the at least one supply conduit and the at least one return conduit of the liquid cooling supply respectively routes a directional flow of a second cooling liquid when the supply conduit is connected to a liquid supply, wherein the rack-level liquid cooling supply is a part of a rack-level cooling system having a cooling rail comprised of Modular Liquid Distribution (MLD) conduits, where the at least one supply conduit and the at least one return conduit are respectively provided via respective supply and return MLD conduits, which sealably attach to corresponding supply and return ports of the second liquid manifold.

15. The RIHS of claim 14, wherein:

the at least one LC node comprises a power node that includes redundant AC-to-DC power supply modules;

the immersion cooling liquid comprises a liquid dielectric coolant;

an inlet port of the power node comprises an AC input; and at least one power distribution outlet port of the power node comprises a DC output.

16. A method of assembling a Rack Information Handling System (RIHS), the method comprising:

mounting in a rack a node-receiving chassis having a front access side and an opposing rear side;

attaching in a rear section of the rack a liquid-to-liquid heat exchanger (LTLHE) comprising:
- at least one node-receiving supply port and at least one node-receiving return port;
- a first liquid manifold extending between the at least one node-receiving supply port and the at least one node-receiving return port;
- a second liquid manifold capable of being in sealed fluid connection to a supply conduit and a return conduit of a liquid cooling supply for fluid transfer of a second cooling liquid; and
- a transfer plate formed of thermally conductive material separating the first and second liquid manifolds for transferring heat from the first cooling liquid to the second cooling liquid;

inserting at least one liquid cooled (LC) node into a bay of the node-receiving chassis, the LC node including a node enclosure provisioned with at least one heat-generating component and an internal node-level liquid cooling system of conduits comprising at least one node supply conduit connected for fluid transfer to at least one supply conduit intake port and at least one node return conduit connected for fluid transfer to at least one return conduit output port, the at least one supply conduit intake and return conduit output ports located at an inserted end of the node enclosure and oriented toward the opposing rear side of the node-receiving chassis respectively enabling receipt of a first cooling liquid at a first temperature and return of the first cooling liquid at an increased temperature due to heat absorption within the node enclosure;

wherein the at least one supply conduit and the at least one return conduit of the liquid cooling supply respectively routes a directional flow of a second cooling liquid when the supply conduit is connected to a liquid supply, wherein the rack-level liquid cooling supply is a part of a rack-level cooling system having a cooling rail comprised of Modular Liquid Distribution (MLD) conduits, where the at least one supply conduit and the at least one return conduit are respectively provided via respective supply and return MLD conduits, which sealably attach to corresponding supply and return ports of the second liquid manifold.

17. A method of assembling a Rack Information Handling System (RIHS), the method comprising:

inserting one or more nodes containing electrical power consuming components into one or node-receiving bays of a rack;

inserting into the rack a power node having a power node enclosure sealed to contain immersion cooling liquid and provisioned with at least one heat generating component;

electrically connecting to rack electrical power distribution components a power node inlet port and at least one power distribution outlet port of the power node that respectively receives facility power and distributes power to the internal Information Handling System (IHS) components; and sealably engaging for fluid transfer at least one liquid to liquid heat transfer mechanism having a first surface that is impinged upon by a volume of at least one of the immersion cooling liquid and immersion cooling liquid vapor and a second surface that receives a flow of a second cooling liquid via a liquid manifold providing a system of conduits that is sealably engage to the supply and return conduits of the liquid cooling supply to enable a flow of the second cooling liquid manifold to absorb heat from the power node enclosure;

wherein the supply conduit and the return conduit of the liquid cooling supply respectively routes a directional flow of a second cooling liquid when the supply conduit is connected to a liquid supply, wherein a rack-level liquid cooling supply is a part of a rack-level cooling system having a cooling rail comprised of Modular Liquid Distribution (MLD) conduits, where the supply conduit and the return conduit are respectively provided via respective supply and return MLD conduits, which sealably attach to corresponding supply and return ports of the second liquid manifold.

18. A power node comprising:

a power node enclosure receivable in a power node-receiving bay of a rack, sealed to contain immersion cooling liquid, and provisioned with at least one heat generating component that receives and distributes electrical power for use by other nodes within the IHS;

a power node inlet port and at least one power distribution outlet port that respectively receives facility power and distributes power to the internal IHS components; and at least one liquid to liquid heat transfer mechanism having a first surface that is impinged upon by a volume of at least one of the immersion cooling liquid and immersion cooling liquid vapor and a second surface that receives a flow of a second cooling liquid via a liquid manifold providing a system of conduits that is sealably engage to the supply and return conduits of the liquid cooling supply to enable a flow of the second cooling liquid manifold to absorb heat from the power node enclosure;

wherein the supply conduit and the return conduit of the liquid cooling supply respectively routes a directional flow of a second cooling liquid when the supply conduit is connected to a liquid supply, wherein a rack-level liquid cooling supply is a part of a rack-level cooling system having a cooling rail comprised of Modular Liquid Distribution (MLD) conduits, where the supply conduit and the return conduit are respectively provided via respective supply and return MLD conduits, which sealably attach to corresponding supply and return ports of the second liquid manifold.

19. The power node of claim 18, wherein:

the at least one heat generating component comprises redundant AC-to-DC power supply modules;

the immersion cooling liquid comprises a liquid dielectric coolant;

the power node inlet port comprises an AC input; and at least one power distribution outlet port comprises a DC output.

* * * * *